US006777156B1

(12) United States Patent
Goto et al.

(10) Patent No.: US 6,777,156 B1
(45) Date of Patent: *Aug. 17, 2004

(54) DIRECTLY IMAGEABLE PLANOGRAPHIC PRINTING PLATE PRECURSOR AND A METHOD OF PRODUCING PLANOGRAPHIC PLATES

(75) Inventors: Kazuki Goto, Shiga (JP); Michihiko Ichikawa, Shiga (JP); Norimasa Ikeda, Shiga (JP)

(73) Assignee: Toray Industries, Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 108 days.

(21) Appl. No.: 09/188,598

(22) Filed: Nov. 9, 1998

(30) Foreign Application Priority Data

| | | |
|---|---|---|
| Nov. 7, 1997 | (JP) | 9-305673 |
| Nov. 27, 1997 | (JP) | 9-326002 |

(51) Int. Cl.$^7$ .............................. G03F 7/09; G03F 7/11

(52) U.S. Cl. .............................. 430/270.1; 430/272.1; 430/273.1; 430/302; 430/303; 430/309; 430/3.48

(58) Field of Search .......................... 430/272.1, 270.1, 430/303, 309, 273.1, 302, 348, 944, 945

(56) References Cited

U.S. PATENT DOCUMENTS

| | | | | | |
|---|---|---|---|---|---|
| 4,769,308 | A | * | 9/1988 | Hiruma et al. | 430/272 |
| 5,491,046 | A | | 2/1996 | DeBoer et al. | 430/302 |
| 5,786,125 | A | * | 7/1998 | Tsuchiya et al. | 430/272.1 |
| 5,853,958 | A | * | 12/1998 | Cheng et al. | 430/286.1 |
| 5,871,883 | A | * | 2/1999 | Hirano et al. | 430/272.1 |
| 5,932,392 | A | * | 8/1999 | Hirai et al. | 430/270.1 |
| 6,171,748 | B1 | * | 1/2001 | Tanaka et al. | 430/138 |
| 6,194,122 | B1 | * | 2/2001 | Ichikawa et al. | 430/272.1 |
| 2002/0072011 | A1 | * | 6/2002 | Murota et al. | 430/273.1 |
| 2002/0121206 | A1 | * | 9/2002 | Ooishi | 101/450.1 |

FOREIGN PATENT DOCUMENTS

| | | |
|---|---|---|
| EP | 0 802 067 | 5/1997 |
| WO | WO 97/39894 | 10/1997 |

OTHER PUBLICATIONS

JP 10329443 A (Torey Ind Inc), Dec. 15, 1998.

* cited by examiner

*Primary Examiner*—Mark F. Huff
*Assistant Examiner*—Barbara Gilliam
(74) *Attorney, Agent, or Firm*—Morrison & Foerster LLP

(57) ABSTRACT

A directly imageable planographic printing plate precursor, which may be of the positive or negative type, has at least a heat sensitive layer on a substrate. The heat sensitive layer contains a light-to-heat conversion material and a metal-containing organic compound.

18 Claims, No Drawings

DIRECTLY IMAGEABLE PLANOGRAPHIC PRINTING PLATE PRECURSOR AND A METHOD OF PRODUCING PLANOGRAPHIC PLATES

The present invention relates to directly imageable planodgraphic printing plate precursor, sometimes referred to as "raw plate", which can be directly processed by laser light and, in particular, it relates to a directly imageable waterless planographic printing plate precursor which enables printing to be conducted without using dampening water.

The direct manufacture of an offset printing plate from an original image without using a plate making film, that is to say directly imageable plate making, is beginning to become popular not only in short run printing fields but also more generally in the offset printing and gravure printing fields on account of its special features such as its simplicity and lack of requirement for skill, its speediness in that the printing plate is obtained in a short time, and its rationality in making possible selection from diverse systems according to quality and cost.

In particular, very recently, as a result of rapid advances in output systems such as prepress systems, image setters and laser printers, etc, new types of various directly imageable planographic printing plates have been developed.

Classifying these planographic printing plates by the plate making method employed, such methods include the method of irradiating with laser light, the method of inscribing with a thermal head, the method of locally applying voltage with a pin electrode, and the method of forming an ink repellent layer or ink receptive layer with an ink jet. Of these, the method employing laser light is more outstanding than the other systems in terms of resolution and the plate making speed, and there are many varieties thereof.

The printing plates employing laser light may be further divided into two types, the photon mode type which depends on photo-reaction and the heat mode type in which light-to-heat conversion takes place and a thermal reaction brought about. In particular, with the heat mode type there is the advantage that handling is possible in a bright room and, furthermore, due to rapid advances in the semiconductor lasers which serve as the light source, recently a fresh look has been taken at the usefulness thereof.

For example, in U.S. Pat. No. 5,339,737, U.S. Pat. No. 5,353,705, U.S. Pat. No. 5,378,580, U.S. Pat. No. 5,487,338, U.S. Pat. No. 5,385,092, U.S. Pat. No. 5,649,486, U.S Pat. No. 5,704,291 and U.S. Pat. No. 5,570,636, there are described directly imageable waterless planographic printing plate precursors which use laser light as the light source, together with their plate making methods.

The heat sensitive layer in this kind of thermal-breakdown type printing plate precursor uses primarily carbon black as the laser light absorbing compound and nitrocellulose as the thermally-decomposing compound and has, applied to its surface, a silicone rubber layer. The carbon black absorbs the laser light, converting it into heat energy, and the heat sensitive layer is broken down by this heat. Moreover, finally, these regions are eliminated by developing, as a result of which the surface silicone rubber layer separates away at the same time and ink-receptive regions are formed.

However, with these printing plates, since the image is formed by breakdown of the heat sensitive layer, the image ditch cells are deepened, so that problems arise in that the ink receptiveness at the minute halftone dots is impaired and the ink mileage is poor. Furthermore, in order that the heat sensitive layer readily undergoes thermal breakdown, a crosslinked structure is formed and so there is also the problem that the durability of the printing plate is poor. If the heat sensitive layer is made more flexible, the sensitivity drops markedly and indeed making the heat sensitive layer flexible has been difficult. Moreover, with such a printing plate, the sensitivity being low, there is also the problem that a high laser intensity is needed to break down the heat sensitive layer.

In JP-A-09-146264, there is proposed a negative type laser-sensitive waterless planographic printing plate precursor which has, in the light-to-heat conversion layer, a compound which converts laser light to heat, a polymeric compound with film forming capability, a photopolymerization initiator and an ethylenically unsaturated compound which can be photopolymerized, and by carrying out exposure of the entire face by UV irradiation following the formation of the silicone rubber layer, reaction takes place between the light-to-heat conversion layer and the silicone rubber layer.

In this printing plate, by carrying out exposure of the entire face following the application of the silicone rubber layer, the adhesive strength between the silicone rubber layer and the light sensitive layer is increased, with the result that a printing plate of outstanding image reproducibility and scratch resistance is obtained. However, as stated above, there is a trade-off between the flexibility of the light sensitive layer and sensitivity, and this has presented the problem in particular of low sensitivity.

In JP-A-09-239942, a peeling development type printing plate is proposed which contains, in a laser-responsive layer, a material which generates acid and a polymeric compound which is decomposed by the action of the acid, but since two steps are required, namely a laser irradiation step and a heating step, the process becomes more complex and there is also the inherent problem of peeling development in that the reproducibility of minute half tone dots is poor.

In U.S. Pat. No. 5,379,698 there is described a directly imageable waterless planographic printing plate which employs a thin metal film as a heat sensitive layer. With this printing plate, the heat sensitive layer is rather thin, so a very sharp image is obtained and this is advantageous in terms of the degree of resolution of the printing plate. However, the adhesion between the base material and the heat sensitive layer is poor and the heat sensitive layer in non-image regions separates away during the printing and this has presented the problem that ink adheres thereto, producing faults on the printed material. Moreover, with this printing plate, the image is also formed by breakdown of the heat sensitive layer, and again this presents the problem that the image ditch cells are deepened and the ink acceptance and ink mileage are impaired.

As well as the aforesaid negative type planographic printing plates, in particular in relation to directly imageable waterless planographic printing plates, positive type directly imageable waterless planographic printing plates may also be considered.

With this type of printing plate, the silicone rubber layer in the laser irradiated regions is selectively retained, and serves to provide the non-image regions. The mechanism thereof comprises some form of enhancement in the adhesive strength between the silicone rubber layer and laser-responsive layer due to the laser irradiation, or an enhancement in the adhesive strength of the laser-responsive layer and the substrate below, with the result that the unirradiated silicone rubber layer, or silicone rubber layer and laser-responsive layer, is/are selectively removed by the subsequent treatment.

The printing plate proposed in JP-A-09-120157 is one where an acid generated by laser irradiation acts as a catalyst to promote the reaction of the light sensitive layer, so that image reproduction is realized. However, a separate heat treatment step is necessary to promote the reaction following the acid generation, so the process becomes more complex. Moreover, following the acid generation, the time which elapses up to the heat treatment exerts an influence on the image reproducibility and this presents the problem that this image reproducibility is unstable.

The present invention seeks to provide positive and negative type directly imageable printing plate precursors which overcome the aforesaid disadvantages, do not require a complex process following the laser irradiation, and provide printing plates having high sensitivity and high image reproducibility.

In order to solve the abovementioned problems, the present invention provides a directly imageable planographic printing plate precursor having at least a heat sensitive layer on a substrate, which heat sensitive layer contains a light-to-heat conversion material and at least one organic compound containing a metal.

References herein to "directly imageable" indicate that the image forming is carried out directly from the recording head onto the printing plate precursor without using a negative or positive film at the time of exposure.

The directly imageable planographic printing plate precursors of the present invention are applicable to so-called waterless planographic printing plates which do not require dampening water or to so-called conventional pre-sensitized planographic printing plates which employ dampening water, but they can be particularly favourably used for waterless planographic printing plates.

Examples of the construction of a waterless planographic printing plate are the construction having a heat sensitive layer on a substrate and having an ink repellent layer thereon, the construction having a heat insulating layer on a substrate, with a heat sensitive layer thereon and furthermore having an ink repellent layer on this, or the construction which also have a protective film on these. As the ink repellent layer referred to here, there is preferably employed a silicone rubber layer.

Examples of the construction of a conventional pre-sensitized planographic printing plate precursor are constructions having a heat sensitive layer on a substrate, and having a hydrophilic layer as an ink repellent layer thereon, the construction having a hydrophilic layer as an ink repellent layer on a substrate and having a heat sensitive layer thereon, or having a heat sensitive layer on a hydrophilic substrate. As examples of the hydrophilic layer which serves as the ink repellent layer referred to here, there are polyvinyl alcohol and hydrophilic swellable layers, but from the point of view of ink repellency a hydrophilic swellable layer is preferred. Again, as the hydrophilic substrate referred to here, there is preferably used an aluminium substrate which has been subjected to a hydrophilicity-conferral treatment such as sand roughening or anodizing.

Next, explanation is given primarily of a directly imageable waterless planographic printing plate precursor but the present invention is not to be restricted thereto.

Heat Sensitive Layer (a) Light to Heat Conversion Material

When utilising a printing plate precursor of the present invention, the image is formed by irradiating with laser light and so it is necessary to include a light-to-heat conversion material.

There are no particular restrictions on the light-to-heat conversion material provided that it absorbs laser light and, for example, it will be appropriate to use additives such as black pigments, e.g. carbon black, aniline black and cyanine black, green pigments of the phthalocyanine or naphthalocyanine type, carbon graphite, iron powder, diamine type metal complexes, dithiol type metal complexes, phenolthiol type metal complexes, mercaptophenol type metal complexes, inorganic compounds containing water of crystallization (such as copper sulphate), chromium sulphide, silicate compounds, metal oxides such as titanium oxide, vanadium oxide, manganese oxide, iron oxide, cobalt oxide and tungsten oxide, the hydroxides and sulphates of these metals, and metal powders of bismuth, iron, magnesium and aluminium.

Of these, carbon black is preferred from the point of view of its light-to-heat conversion factor, cost and ease of handling.

As well as the above materials, infrared- or near infrared-absorbing dyes can also be favourably used as the light-to-heat conversion material.

As these dyestuffs, there can be used all dyestuffs which has a maximum absorption wavelength in the range 400 nm to 1200 nm, but the preferred dyes are those used for electronics or recording, of the cyanine type, phthalocyanine type, phthalocyanine metal complex type, naphthalocyanine type, naphthalocyanine metal complex type, dithiol metal complex type (such as dithiol nickel complex type), naphthoquinone type, anthraquinone type, indophenol type, indoaniline type, indoaniline metal complex type, pyrylium type, thiopyrylium type, squarilium type, croconium type, azulenium type, diphenylmethane type, triphenylmethane type, triphenylmethane phthalide type, triallylmethane type, phenothiazine type, phenoxazine type, fluoran type, thiofluoran type, xanthene type, indolylphthalide type, azaphthalide type, chromenopyrazole type, leucoauramine type, rhodamine lactam type, quinazoline type, diazaxanthene type, bislactone type, fluorenone type, monoazo type, ketone imine type, disazo type, polymethine type, oxazine type, nigrosine type, bisazo type, bisazostilbene type, bisazooxadiazole type, bisazofluorenone type, bisazohydroxyperinone type, azochromium complex salt type, trisazotriphenylamine type, thioindigo type, perylene type, nitroso type, 1:2 metal complex salt type, intermolecular CT type, quinoline type, quinophthalone type and flugide type acid dyes, basic dyes, oil-soluble dyes, and triphenylmethane type leuco dyes, cationic dyes, azo type disperse dyes, benzothiopyran type spiropyran, 3,9-dibromoanthoanthrone, indanthrone, phenolphthalein, sulphophthalein, ethyl violet, methyl orange, fluorescein, methyl viologen, methylene blue and dimroth betaine.

Of these, cyanine dyes, azulenium dyes, squarilium dyes, croconium dyes, azo disperse dyes, bisazostilbene dyes, naphthoquinone dyes, anthraquinone dyes, perylene dyes, phthalocyanine dyes, naphthalocyanine metal complex dyes, polymethine type dyes, dithiolnickel complex dyes, indoaniline metal complex dyes, intermolecular CT dyes, benzothiopyran type spiropyran and nigrosine dyes, which are dyes employed for electronics or for recording, and have a maximum absorption wavelength in the range from 700 nm to 900 nm, are preferably used.

Furthermore, from amongst these dyes, those having a large molar absorptibility, formerly referred to as "molar extinction coefficient" are preferably used. Specifically, $\epsilon$ is preferably at least $1\times10^4$ and more preferably at least $1\times10^5$. This is because if $\epsilon$ is smaller than $1\times10^4$, a sensitivity enhancement effect is difficult to realise.

Using such light-to-heat conversion materials on their own gives a sensitivity enhancement effect, but by jointly employing two or more types it is possible to further enhance the sensitivity.

Again, by jointly employing two or more light-to-heat conversion materials with different absorption wavelengths, it is also possible to utilise with two or more types of laser with different emission wavelengths.

The light-to-heat conversion material content is preferably from 0.1 to 70 wt %, and more preferably from 0.5 to 40 wt %, in terms of the heat sensitive layer composition as a whole. If there is less than 0.1 wt %, no sensitivity enhancement effect in terms of laser light is to be seen, while with more than 40 wt % the durability of the printing plate tends to be lowered.

(b) Metal-Containing Organic Compound

The heat sensitive layer of a printing plate precursor of the present invention contains a metal-containing organic compound. The metal-containing organic compound may be a compound consisting of an organic portion and a central metal (i.e. disposed between respective organic groups or within an organic portion such as an organic ring) and may be a complex compounds in which there is co-ordinate bonding between the organic portion and the central metal or an organometallic compounds in which the central metal is covalently bonded to the organic portion. Inorganic compounds such as metal oxides do not fall within this category. These metal-containing organic compounds are characterized by the fact that they bring about a substitution reaction with compounds containing active hydrogen groups.

As examples of the central metal, there are the metals of Groups 2 to 6 of the Periodic Table. Of these, the metals of Periods 3 to 5 are preferred, with the Period 3 metal Al, the Period 4 metals Ti, Mn, Fe, Co, Ni, Cu, Zn and Ge, and the Period 5 metals In and Sn being particularly preferred.

Preferably, the metal-containing organic compound is a metal chelate compound.

Metal chelate compounds are formed between a chelate portion and an aforesaid metal at the centre (as explained above).

Specific examples of metal-containing organic compounds and types thereof which may be present in a heat-sensitive layer of a printing plate precursor embodying the invention are as follows.

(1) Metal Diketenates

These are metal chelate compounds in which the hydroxyl groups of the enol hydroxyl groups of diketones are substituted with a metal atom, and the central metal is bonded via oxygen atoms. Since there can also be co-ordination bonding of the diketone carbonyls to the metal, they are comparatively stable compounds.

Specific examples are metal pentanedionates (metal acetonates) in which the chelate portion is 2,4-pentadionate (acetylacetonate), fluoropentadionate, 2,2,6,6-tetramethyl-3,5-heptanedionate, benzoylacetonate, thenoyltrifluoroacetonate and 1,3-diphenyl-1,3-propane-dionate, metal acetoacetates in which the chelate portion is methylacetoacetate, ethylaceto-acetate, methacryloxyethylacetoacetate and acryloylacetoacetate, and salicylaldehyde complexes.

(2) Metal Alkoxides

These are compounds in which an alkyl group is bonded to a central metal via an oxygen atom. Examples are metal alkoxides in which the chelate portion is methoxide, ethoxide, propoxide, butoxide, phenoxide, allyloxide, methoxyethoxide or aminoethoxide.

(3) Alkyl Metals

These are compounds in which alkyl groups are directly bonded to the central metal and, in such circumstances, the metal is bonded to a carbon atom. Even where the organic portion compound is a diketone, if the metal is bonded at a carbon atom, then it is placed in this category. Amongst such compounds, acetylacetone metals are preferred.

(4) Metal Carboxylic Acid Salts

Examples include acetic acid metal salts, lactic acid metal salts, acrylic acid metal salts, methacrylic acid metal salts and stearic acid metal salts.

(5) Others

Examples of these include metal oxide chelate compounds such as titanium oxide acetonate, metal complexes such as titanocene phenoxide (diphenoxy, dicyclopentadienyl titanium) and heterometal chelate compounds with at least two types of metal atom in one molecule.

From amongst the above metal-containing organic compounds, the following can be given as specific examples of the metal-containing organic compounds which are preferably used.

As specific examples of organic compounds containing aluminum, there are aluminium isopropylate, mono sec-butoxyaluminium diisopropylate, aluminium sec-butylate, ethyl acetate aluminium diisopropylate, propyl acetate aluminium diisopropylate, butyl acetate aluminium diisopropylate, heptyl acetate aluminium diisopropylate, hexyl acetate aluminium diisopropylate, octyl acetate aluminium diisopropylate, nonyl acetate aluminium diisopropylate, ethyl acetate aluminium diethylate, ethyl acetate aluminium dibutylate, ethyl acetate aluminium diheptylate, ethyl acetate aluminium dinonylate, diethylacetate aluminium isopropylate, aluminium tris-(ethylacetoacetate), aluminium tris(propylacetoacetate), aluminium tris(butylacetoacetate), aluminium tris (hexylacetoacetate), aluminium tris(nonylacetoacetate), aluminium trisacetylacetonate, aluminium bisethylacetoacetate monoacetylacetonate, aluminium diacetylacetonate ethylacetoacetate, aluminium monoacetylacetonate bispropylacetoacetate, aluminium monoacetylacetonate bisbutylacetoacetate, aluminium monoacetylacetonate bishexylacetoacetate, aluminium monoethylacetoacetate bispropylacetoacetonate, aluminium monoethylacetoacetate bisbutylacetoacetonate, aluminium monoethylacetoacetate bishexylacetoacetonate, aluminium monoethylacetoacetate bisnonylacetoacetonate, aluminium dibutoxide monoacetoacetate, aluminium dipropoxide monoacetoacetate, aluminium dibutoxide monoethylacetoacetate, aluminium oxide acrylate, aluminium oxide octate, aluminium oxide stearate, trisalizarin aluminium, aluminium-s-butoxide bis(ethylacetoacetate), aluminium-s-butoxide ethylacetoacetate, aluminium-9-octadecenylacetoacetate diisopropoxide, aluminium phenoxide, aluminium acrylate and aluminium methacrylate.

As specific examples of organic compounds containing titanium, there are isopropyltriisostearoyl titanate, isopropyltri-n-stearoyl titanate, isopropyltrioctanoyl titanate, isopropyltridodecylbenzenesulphonyl titanate, isopropyl-tris(dioctyl pyrophosphite)titanate, tetraisopropylbis-(dioctyl phosphite)titanate, tetraoctylbis (ditridecyl-phosphite)titanate, tetra(2,2-diallyloxymethyl-1-butyl)-bis(ditridecyl)phosphite titanate, bis(dioctyl pyrophosphate)oxyacetate titanate, bis (dioctylpyrophosphate)ethylenetitanate, tris (dioctylpyrophosphate)-ethylenetitanate, isopropyldimethacrylisostearoyltitanate, isopropylisostearoyldiacryltitanate, isopropyltri (dioctylphosphate)titanate, isopropyltricumylphenyltitanate, isopropyltri(n-aminoethylaminoethyl)titanate, dicumylphenyloxyacetate titanate, diisostearoylethylene titanate, isopropyldiisostearoylcumylphenyl titanate, isopropyldistearoylmethacryl titanate, isopropyldiisostearoylacryl titanate, isopropyl 4-aminobenzenesulphonyldi(dodecylbenzenesulphonyl)titanate, isopropyltrimethacryl titanate, isopropyldi(4-aminobenzoyl)isostearoyl titanate, isopropyltri(dioctylpyrophosphate)titanate, isopropyltriacryl titanate, isopropyltri(N,N-dimethylethylamino)titanate, isopropyltrianthranyl titanate, isopropyloctyl, butylpyrophosphate titanate, isopropyldi(butyl, methylpyrophosphate)-titanate, tetraisopropyldi(dilauroylphosphite)titanate, diisopropyloxyacetate titanate, isostearoylmethacryloxyacetate titanate, isostearoylacryloxyacetate titanate, di(dioctyl phosphate)oxyacetate titanate, 4-aminobenzenesulphonyldodecylbenzenesulphonyloxyacetate titanate, dimethacryloxyacetate titanate, dicumylphenolate-oxyacetate titanate, 4-aminobenzoylisostearoyloxyacetate titanate, diacryloxyacetate titanate, di(octyl, butylpyrophosphate)oxyacetate titanate, isostearoylmethacrylethylene titanate, di(dioctyl phosphate)ethylene titanate, 4-aminobenzenesulphonyldodecylbenzenesulphonylethylene titanate, dimethacrylethylene titanate, 4-aminobenzoylisostearoylethylene titanate, diacrylethylene titanate, dianthranylethylene titanate, di(butyl, methylpyrophosphate)ethylene titanate, titanium allylacetoacetate triisopropoxide, titanium bis(triethanolamine)diisopropoxide, titanium-n-butoxide(bis-2,4-pentanedionate), titaniumdiisopropoxidebis(tetramethylheptanedionate), titanium diisopropoxidebis(ethylacetoacetate), titanium methacryloxyethylacetoacetatetriisopropoxide, titanium methylphenoxide and titanium oxide-bis(pentanedionate).

Iron(III) acetylacetonate, dibenzoylmethane iron(II), tropolone iron, tristropolono-iron(III), hinokitiol iron, trishinokitiolo-iron(III), acetoacetic acid ester iron(III), iron(III) benzoylacetonate, iron(III) trifluoropentanedionate, salicylaldehydo-copper(II), copper(II) acetylacetonate, salicylaldehydoimine copper, copper kojate, biskojato-copper(II), tropolone copper, bistropolono-copper(II), bis(5-oxynaphthoquinone-1,4)copper, bis(1-oxyanthraquinone) nickel, acetoacetic acid ester copper, salicylamine copper, o-oxyazobenene copper, copper(II) benzoyl acetate, copper(II) ethylacetoacetate, copper(II) methacryloxyethyl acetoacetate, copper(II) methoxyethoxyethoxide, copper(II) 2,4-penanedionate, copper(II) 2,2,6,6-tetramethyl-3,5-heptanedionate, zinc N,N-dimethylaminoethoxide, zinc 2,4-pentanedionate and zinc 2,2,6,6-tetramethyl-3,5-heptanedionate are also favourably employed in the present invention.

Furthermore, salicylaldehydo-cobalt, o-oxyacetophenone nickel, bis(1-oxyxanthone)nickel, nickel pyromesaconate, salicylaldehydonickel, allyltriethyl germanium, allyltrimethyl germanium, ammonium tris(oxalate)germanate, bis[bis(trimethylsilyl)amino]germanium(II), carboxyethylgermanium sesquioxide, cyclopentadienyltrimethyl germanium, di-n-butyldiacetoxygermanium, di-n-butyldichlorogermanium, dimethylaminotrimethylgermanium, diphenylgermanium, hexaallyldigermoxane, hexaethyldigermoxane, hexamethyldigermanium, hydroxygermatrane monohydrate, methacryloxymethyltrimethylgermanium, methacryloxytriethylgermanium, tetraallylgermanium, tetra-n-butylgermanium, tetraisopropoxygermanium, tri-n-butylgermanium, trimethylchlorogermanium, triphenylgermanium, vinyltriethylgermanium, bis(2,4-pentanedionate)dichlorotin, di-n-butylbis(2,4-pentanedionate)-tin, calcium 2,4-pentanedionate, cerium(III) 2,4-pentanedionate, cobalt(II) 2,4-pentanedionate, cobalt(III) 2,4-pentanedionate, europium 2,4-pentanedionate, europium(III) thenoyltrifluoroacetonate, indium 2,4-pentanedionate, manganese(II) 2,4-pentanedionate, and manganese(III) 2,4-pentanedionate are also used in the present invention.

From amongst these metal-containing organic compounds,metal chelate compounds are preferably used and metal dikenates such as aluminium, iron(III) and titanium acetylacetonates (pentanedionates), ethylacetoacetonates (hexanedionates), propylacetoacetonates (heptanedionates), tetramethylheptanedionates and benzoylacetonates are particularly preferably used.

These metal-containing organic compounds can each be used on their own or they can be used in the form of mixtures of two or more types. The amount contained per 100 parts by weight of active hydrogen group-containing compound is preferably from 5 to 300 parts by weight, with from 10 to 150 parts by weight being further preferred. This is because if the amount is less than 5 parts by weight, then image formation becomes difficult, while with more than 300 parts by weight the properties of the heat sensitive layer tend to be lowered and problems tend to arise with the printing plate; such as for example problems in terms of printing durability.

When a printing plate precursor of the present invention is subjected to laser irradiation, heat is generated due to the action of the light-to-heat conversion material in the heat sensitive layer and, as a result of this heat, the metal-containing organic compound gives rise to reaction. In the case where the heat sensitive layer does not have a crosslinked structure, a positive type directly imageable waterless planographic printing plate is obtained. That is to say, the metal chelate compound in the regions which have undergone laser irradiation reacts and forms a crosslinked structure. As a result, in the laser irradiated regions, the adhesive strength between the silicone rubber layer and the heat sensitive layer is raised. On the other hand, in the un-irradiated regions, there is no such raising of the adhesive strength, so, by means of the subsequent developing treatment, there is elimination of the silicone rubber layer or of the silicone rubber layer and heat sensitive layer.

In the case where a crosslinked structure has already been formed in the heat sensitive layer, a negative type directly imageable waterless planographic printing plate is obtained. That is to say, the adhesive strength between the heat sensitive layer and the silicone rubber layer is lowered in the laser irradiated regions and, by means of the subsequent developing treatment, the silicone rubber layer is eliminated in those regions which have been subject to laser light irradiation. The detailed mechanism thereof is still unclear but it appears that, where a crosslinked structure has already been formed at the time of the plate processing, there is an elimination reaction due to the action of the heat produced by the laser irradiation. As a result, it is believed that the solvent resistance at the interface between the silicone rubber layer and the heat sensitive layer is altered and so there is specific elimination of the silicone rubber layer in the laser-irradiated regions during the developing treatment.

Just the silicone rubber layer or both the silicone rubber layer and the heat sensitive layer may be eliminated by the development, but it is preferred in terms of ink mileage that the heat sensitive layer remains.

(c) Active Hydrogen Group-containing Compound

In order to form a crosslinked structure with the metal chelate compound, it is preferred that the heat sensitive layer in the printing plate raw plate of the present invention also contains an active hydrogen group-containing compound. As examples of the active hydrogen group-containing compound there are compounds which contain a hydroxyl group, compounds which contain an amino group, compounds which contain a carboxyl group and compounds which contain a thiol group, but hydroxyl group-containing compounds are preferred.

Furthermore, the hydroxyl group-containing compounds may be either compounds which contain a phenolic hydroxyl group or compounds which contain an alcoholic hydroxyl group.

As examples of phenolic hydroxyl group-containing compounds there are the following compounds:

hydroquinone, catechol, guaiacol, cresol, xylenol, naphthol, dihydroxyanthraquinone, dihydroxybehzophenone, trihydroxybenzophenone, tetrahydroxybenzophenone, bisphenol A, bisphenol S, phenol formaldehyde novolak resins, resol resins, resorcinol benzaldehyde resins, pyrogallol acetone resins, hydroxystyrene polymers and copolymers, rosin-modified phenolic resins, epoxy-modified phenolic resins, lignin-modified phenolic resins, aniline-modified phenolic resins, melamine-modified phenolic resin and bisphenols.

Again, as examples of alcoholic hydroxyl group-containing compounds there are the following compounds:

ethylene glycol, diethylene glycol, triethylene glycol, tetraethylene glycol, polyethylene glycol, propylene glycol, dipropylene glycol, polypropylene glycol, 1,3-butanediol, 1,4-butanediol, 1,6-hexanediol, 1,8-octanediol, 1,9-nonanediol, 1,10-decanediol, 2-butene-1,4-diol, 5-hexene-1,2-diol, 7-octene-1,2-diol, 3-mercapto-1,2-propanediol, glycerol, diglycerol, trimethylolpropane, 1,2,4-butanetriol, pentaerythritol, dipentaerythritol, sorbitol, sorbitan, polyvinyl alcohol, cellulose and derivatives thereof, and hydroxyethyl (meth)acrylate polymers and copolymers.

Furthermore, it is also possible to use in the present invention epoxy acrylates, epoxy methacrylates, polyvinyl butyral resins and polymers into which hydroxyl groups have been incorporated by known methods.

From the point of view of their reactivity with the metal chelate compounds, compounds containing a phenolic hydroxyl group are particularly preferably used as the hydroxyl group-containing compound.

These active hydrogen group-containing compounds can each be used on their own or they can be used in the form of mixtures of two or more types. The amount incorporated is preferably from 5 to 80 wt % and more preferably from 20 to 60 wt % in terms of the heat sensitive layer composition as a whole. If the content is less than 5 wt % then the printing plate sensitivity is lowered while, conversely, if there is more than 80 wt % the solvent resistance of the printing plate tends to be reduced.

(d) Binder Polymer

From the point of view of the printing durability, the heat sensitive layer of the printing plate raw plate of the present invention preferably contains binder polymer. This binder polymer is not especially restricted provided that it is soluble in organic solvents and has a film-forming capability, but it is preferred that its glass transition temperature (Tg) be no more than 20° C. and more preferably no more than 0° C.

As specific examples of binder polymers which are soluble in organic solvents and have a film-forming capability and, furthermore, which also provide a shape-retaining function, there are vinyl polymers, unvulcanized rubber, polyoxides (polyethers), polyesters, polyurethanes and polyamides.

The binder polymer content is preferably from 5 to 70 wt % and more preferably from 10 to 50 wt % in terms of the heat sensitive layer composition as a whole. If less than 5% is incorporated, then the printing durability tends to be reduced whereas with more than 70 wt % the sensitivity tends to be lowered.

These binder polymers can be used singly or there can be used a mixture of several such polymers.

(e) Other Components

Additionally, where required, there may also be added levelling agents, surfactants, dispersing agents, plasticizers and other additives to the heat sensitive layer in the present invention.

The addition of coupling agents, such as silane coupling agents, can be carried out with considerable advantage to raise the adhesion properties in terms of the underlayer substrate or heat insulating layer.

Furthermore, in order to raise the adhesion properties in terms of the upper silicone rubber layer, there is also preferably added a silyl group-containing compound or an unsaturated group-containing compound. In particular, when the upper ink repellent layer is an addition type silicone rubber layer, there is preferably added a compound of the kind which contains both unsaturated and silyl groups. As specific examples of such compounds, it is possible to cite the compounds of the following structure.

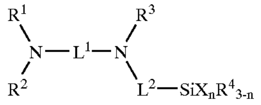

Here, $R^1$, $R^2$ and $R^3$ are each a hydrogen atom, $C_1$ to $C_{20}$ substituted or unsubstituted alkyl group, substituted or unsubstituted phenyl group or substituted or unsubstituted aralkyl group, and they may be individually the same as or different from one another. $L^1$ and $L^2$ are each, independently of one another, a divalent linking group. Furthermore, n is 0, 1 or 2, and $R^4$ is a $C_1$ to $C_{20}$ substituted or unsubstituted alkyl group, a substituted or unsubstituted aryl group or a vinyl group. X represents a hydrogen atom, halogen atom, —$OCOR^5$ (acyloxy group) or —O—N=C($R^6$)($R^7$). Here, $R^5$, $R^6$ and $R^7$ are $C_1$ to $C_4$ substituted or unsubstituted alkyl groups.

Preferably, the structure is such that at least one and more preferably at least two of $R^1$, $R^2$ and $R^3$ are unsaturated groups.

With regard to the properties of the heat sensitive layer obtained in this way, from the point of view of the printing characteristics of the printing plate obtained it is preferred that the properties lie within a specified range. As examples thereof, there are the tensile properties, of which the initial elastic modulus in tension can be given as a typical example. Specifically, the initial elastic modulus of the heat sensitive layer in the printing plate, in tension, is preferably from 7 $kgf/mm^2$ to 78 $kgf/mm^2$ and more preferably from 10 $kgf/mm^2$ to 65 $kgf/mm^2$.

By setting the initial elastic modulus of the heat sensitive layer within the aforesaid range, it is possible to enhance the properties as a printing plate, in particular the printing durability. Conversely, if the initial elastic modulus is less than 7 $kgf/mm^2$, the heat sensitive layer forming the image areas will tend to be sticky and pulling will tend to occur at the time of printing. Furthermore, in the case where the initial elastic modulus is more than 78 $kgf/mm^2$, breakdown will tend to occur at the interface between the heat sensitive layer and the silicone rubber layer due to the repeated stress applied at the time of printing, and this lowers the printing durability.

With regard to the thickness of the heat sensitive layer, it is preferred that this be from 0.1 to 10 $g/m^2$ as a covering layer from the point of view of the printing durability of the printing plate and also from the point of view of outstanding productivity in that the diluting solvent may be readily driven off. From 1 to 7 $g/m^2$ is still further preferred.

Silicone Rubber Layer

For the silicone rubber layer employed in the printing plate precursor of the present invention, there can be used the silicone rubber layers utilized in conventional waterless planographic printing plates.

Such a silicone rubber layer may be obtained by lightly crosslinking a linear organopolysiloxane (preferably dimethylpolysiloxane), and a typical silicone rubber layer has repeating units of the kind represented by the following formula (I).

(I)

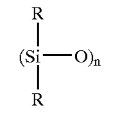

Here n is an integer of 2 or more; and R is a $C_{1-10}$ alkyl, aryl or cyano $C_{1-10}$ group. It is preferred that no more than 40% of all the R groups be vinyl, phenyl, halo-vinyl or halo-phenyl, and that at least 60% of the R groups are methyl. Furthermore, there will be at least one hydroxyl group in the molecular chain, in the form of a chain terminal or pendant group.

As the silicone rubber in the present invention, it is possible to use a silicone rubber where condensation-type crosslinking of the following kind is carried out (RTV or LTV type silicone rubbers). That is to say, crosslinking is effected by condensation between the terminal groups represented by formula (II) and formula (III) or formula (IV). At this time there may also be present in the system excess crosslinking agent.

(II)

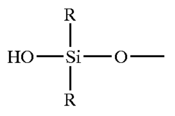

were, R has the same meaning as R in formula I above;

(III)

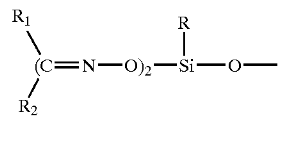

where, R has the same meaning as R in formula I above, and $R^1$ and $R^2$ are monovalent lower alkyl groups;

(V)

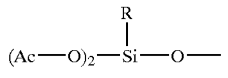

where, R has the same meaning as R in formula I above and Ac is an acetyl group.

When carrying out such condensation type crosslinking, there may be added a catalyst such as a tin, zinc, lead, calcium, manganese or other such metal salt of a carboxylic acid, for example dibutyltin laurate, or tin(II) octoate or naphthenate, or alternatively chloroplatinic acid.

Besides this, adding a SiH group-containing polydimethylsiloxane or a silane (or siloxane) with a hydrolyseable functional group is also effective and, furthermore, with the objective of enhancing the rubber strength, there may be freely added known fillers such as silica.

Moreover, in the present invention, as an alternative, or in addition, to the aforesaid condensation type silicone rubber layer it is also possible to use an addition type silicone rubber layer. The use of an addition type silicone rubber layer is preferred from the point of view of the handling properties.

An addition type silicone rubber layer can be formed for example by applying, on the heat sensitive layer, a polyorganosiloxane with at least two vinyl groups in the molecule, a polyorganosiloxane with at least three SiH groups in the molecule and a platinum catalyst, diluted with a suitable solvent, and then heating and drying, and curing.

The organopolysiloxane with at least two vinyl groups in the molecule may have the vinyl groups either at the chain ends or along the chain and, as the organic groups other than alkenyl groups, substituted or unsubstituted alkyl groups or aryl groups are preferred. Furthermore, there may also be present a small amount of hydroxyl groups.

As specific examples of such polyorganosiloxanes with at least two vinyl groups in the molecule there are the following:

polydimethylsiloxanes with vinyl groups at both terminals, (methylvinylsiloxane)(dimethylsiloxane) copolymers with methyl groups at both terminals, (methylvinylsiloxane)(dimethylsiloxane) copolymers with vinyl groups at both terminals, compounds comprising two or more main chains of a polydimethylsiloxane with vinyl groups at both terminals and with dimethylene crosslinks between, (methyl 1-hexenesiloxane)(dimethylsiloxane) copolymers with methyl groups at both terminals and (methyl 1-hexenesiloxane)(dimethylsiloxane) copolymers with vinyl groups at both terminals.

From the point of view of the rubber properties after curing, these polyorganosiloxanes with at least two vinyl groups in the molecule preferably have a molecular weight of at least 5,000, and more preferably at least 10,000. Again, they can be used singly or a number can be mixed together in any proportions for use.

The polyorganosiloxane with at least three SiH groups in the molecule may have the SiH groups at chain terminals or along the chain and, as the organic groups other than SiH groups, substituted or unsubstituted alkyl groups or aryl groups are preferred.

As specific examples of such polyorganosiloxanes with at least three SiH groups in the molecule there are the following:

polydimethylsiloxanes with SiH groups at both terminals, polymethylhydrogensiloxanes with methyl groups at both terminals, (methylhydrogensiloxane)(dimethylsiloxane) copolymers with methyl groups at both terminals, (methylhydrogensiloxane)(dimethylsiloxane) copolymers with SiH groups at both terminals and cyclic polymethylhydrogensiloxane.

With regard to the proportions when using a mixture of the aforesaid vinyl group-containing polyorganosiloxane and SiH group-containing polyorganosiloxane, the preferred mixing proportions are such that, taking the number of vinyl groups in the silicone rubber composition as 1, the number of SiH groups is from 1.5 to 15 and more preferably from 1.5 to 12. If the proportion of SiH groups to vinyl groups is less than 1.5:1, then there is a tendency for the curing properties of the silicone rubber layer to be reduced, while if the proportion is greater than 15 then there is a tendency for the silicone rubber to become brittle and the wear resistance to be lowered, so this is undesirable.

As to the platinum compound which is preferably employed in the addition-type silicone rubber layer, examples include platinum per se, platinum chloride, chloroplatinic acid and olefin-coordinated platinum. Of these, olefin-coordinated platinum is preferred.

Again, with the objective of controlling the curing rate of the addition type silicone rubber layer, it is preferred that there be added a reaction inhibitor such as tetracyclo (methylvinyl)siloxane or other such vinyl group-containing organopolysiloxane, an alcohol with a carbon-carbon triple bond, acetone, methyl ethyl ketone, methanol, ethanol or propylene glycol monomethyl ether.

As well as these components, there may be added a hydroxyl group containing organopolysiloxane or hydrolyseable functional group containing silane (or siloxane) which are condensation type silicone rubber layer components, or for the purposes of raising the rubber strength there can be added a filler such as silica.

Moreover, in the present invention, as well as the above components, the silicone rubber layer preferably contains a silane coupling agent. Specific examples are acetoxysilanes, oximesilanes and alkoxysilanes, but an oximesilane with non-hydrolysing groups such as a vinyl group is particularly suitable. Preferably from 0.1 to 5 wt % and more preferably from 0.5 to 3 wt % of the silane coupling agent is used in terms of the solids component of the silicone rubber layer composition.

The film thickness of the silicone rubber layer is preferably from 0.5 to 20 $g/m^2$ and more preferably from 0.5 to 5 $g/m^2$. If the film thickness is less than 0.5 $g/m^2$ the ink repellency of the printing plate tends to be reduced, while in the case of more than 20 $g/m^2$, not only is this disadvantageous from an economic standpoint but also there is the problem that the ink mileage deteriorates.

Substrate

Provided that it is a dimensionally stable sheet-like material, it is possible to use any metal or film as the substrate for the printing plate precursor of the present invention. As examples of such dimensionally stable sheet-like materials, there are those conventionally employed as printing plate substrates. These substrates include paper, plastic- (for example polyethylene, polypropylene or polystyrene) laminated paper, aluminium (including aluminium alloys), zinc, copper or other such metal sheet, films of plastics material, for example cellulose acetate, polyethylene terephthalate, polyethylene, polyester, polyamide, polyimide, polystyrene, polypropylene, polycarbonate or polyvinyl acetal, and also paper or plastics film laminated with, or with a vapour deposited coating of, an aforesaid metal.

Amongst these substrates, aluminium plates are especially preferred in that they have outstanding dimensional stability and, moreover, are comparatively cheap. Again, the polyethylene terephthalate films which are employed as substrates for short-run printing are also favourably used.

Heat Insulating Layer

In order to prevent the heat due to the laser irradiation escaping into the substrate, it is effective to provide the printing plate precursor of the present invention with a heat insulating layer disposed between the substrate and heat sensitive layer.

There may also be used, typically, the primer layer hitherto employed for achieving firm adhesion between the substrate and heat sensitive layer.

The heat insulating layer used in the present invention needs to satisfy the following conditions. It will bond together well the substrate and the heat sensitive layer, and be stable with passage of time, and it will also be highly resistant to the developer and to the solvents used at the time of printing.

Examples of materials which satisfy such conditions include epoxy resins, polyurethane resins, phenolic resins, acrylic resins, alkyd resins, polyester resins, polyamide resins, urea resins, polyvinyl butyral resins, casein and gelatin. Of these, it is preferred that there be used polyurethane resins, polyester resins, acrylic resins, epoxy resins or urea resins, either singly or in the form of mixtures of two or more types.

Again, it is preferred that the image/non-image region contrast be enhanced by incorporating additives such as pigments or dyestuffs into this heat insulating layer.

The thickness of the heat insulating layer is preferably from 0.5 to 50 $g/m^2$ and more preferably from 1 to 10 $g/m^2$ as a coating layer. If the thickness is less than 0.5 $g/m^2$, there is an inadequate shielding effect in terms of substrate surface shape defects and adverse chemical influences, while if the thickness is more than 50 $g/m^2$ this is disadvantageous from economic considerations, and so the aforesaid range is preferred.

Production Method

Explanation is now provided of the method of producing a directly imageable waterless planographic printing plate precursor of the present invention and the plate processing method.

On the substrate, using a normal coater such as a reverse roll coater, air knife coater, gravure coater, die coater or Meyer bar coater, or a rotary applicator such as a whirler, there is optionally applied a heat insulating layer composition and this is hardened by heating for a few minutes at 100 to 300° C. or by actinic light irradiation, after which the heat sensitive layer composition is applied and dried by heating for from tens of seconds up to several minutes at 50 to 180° C., and hardened where required.

Subsequently, the silicone rubber composition is applied and heat treatment carried out for a few minutes at 50 to 200° C., to obtain a silicone rubber layer. Thereafter, where required, a protective film is laminated or a protective layer formed.

Protective Film

With the objective of protecting the silicone rubber layer on the directly imageable waterless planographic printing plate constructed as explained above, a plain or embossed protective film is laminated at the surface of the silicone rubber layer, or alternatively there may be formed as a protective film a polymer coating which dissolves in the developer solvent.

As examples of types of such protective film, there are polyester films, polypropylene films, polyvinyl alcohol films, saponified ethylene/vinyl acetate copolymer films, polyvinylidene chloride films and various types of metallized film.

Laser Irradiation

The directly imageable waterless planographic printing plate precursor obtained in this way is subjected to image-wise exposure by means of laser light after separating off the protective film or from above the protective film.

As the laser light source employed in the plate processing light-exposure stage of the present invention, one with an oscillation wavelength region in the range 300 nm to 1500 nm is employed. Specifically, various lasers can be used such as an argon ion, krypton ion, helium-neon, helium-cadmium, ruby, glass, YAG, titanium sapphire, dye, nitrogen, metal vapour, excimer, free-electron or semiconductor laser.

Of these, for the purposes of processing the printing plate precursor of the present invention, a semiconductor laser of emission wavelength region in the vicinity of the near infrared region is preferred, with the use of a high output semiconductor laser being particularly preferred.

Developing Method

Following exposure, by employing a developing treatment, a printing plate on which an image pattern has been formed is produced by elimination of the unexposed regions in the case of a positive-type and by elimination of the exposed regions in a negative-type. Developing is carried out by a rubbing treatment in the presence or absence of water or organic solvent. Alternatively, developing is also possible by so-called peeling development where the pattern is formed on the printing plate by the peeling of the protective film.

As the developer used in the developing treatment for preparing a printing plate from a precursor embodying the invention, there can be employed, for example, water or water to which a surfactant is added, or such water to which an undermentioned polar solvent is also added, or at least one type of solvent such as an aliphatic hydrocarbon (e.g. hexane, heptane or isoparaffin type hydrocarbon), aromatic hydrocarbon (e.g. toluene or xylene) or halogenated hydrocarbon (e.g. Triclene), to which at least one undermentioned polar solvent is added.

As examples of the polar solvent, there are alcohols such as ethanol, propanol, isopropanol and ethylene glycol, ethers such as ethylene glycol monoethyl ether, diethylene glycol monoethyl ether, diethylene glycol monobutyl ether and tetrahydrofuran, ketones such as acetone, methyl ethyl ketone and diacetone alcohol, esters such as ethyl acetate, ethyl lactate and ethylene glycol monoethyl ether acetate, and carboxylic acids such as caproic acid, 2-ethylhexanoic acid and oleic acid.

Furthermore, there can be carried out the addition of surfactants to the aforesaid developer liquid composition. Moreover, there can also be added alkali agents such as sodium carbonate, monoethanolamine, diethanolamine, diglycolamine, monoglycolamine, triethanolamine, sodium silicate, potassium silicate, potassium hydroxide and sodium borate.

Of these, water or water to which surfactant has been added, and also water to which alkali has also be added, are preferably used.

Again, it is also possible to add to such developers known basic dyes, acid dyes or oil-soluble dyes such as Crystal Violet, Victoria Pure Blue or Astrazon Red, so as to carry out dyeing of the image region at the same time as the development or following development. By carrying out dyeing, discrimination between the regions eliminated by the development and the remaining regions is facilitated; i.e. the image/non-image region contrast is enhanced. The developing post-treatment liquids "PA-1", "PA-2", "PA-F", "NA-1" and "WH-3", produced by Toray Industries Inc., can be given as preferred examples of the liquid employed in such dyeing.

At the time of the development, these developers can be used to impregnate a nonwoven material, degreased cotton, a cloth or sponge, and the developing carried out by wiping the plate surface.

Furthermore, the developing can also be satisfactorily carried out using a automatic developing machine as described in JP-A-63-163357 where, following pretreatment of the plate surface with an aforesaid developer, the plate surface is rubbed with a rotating brush while showering with, for example, tap water.

Instead of the aforesaid developer, development is also possible by spraying the plate surface with warm water or steam.

Embodiments of the present invention are now explained in further detail by means of Examples. In these Examples, the component (a) is the light-to-heat conversion material, the component (b) is the metal-containing organic compound, the component (c) is the active hydrogen group-containing compound and the component (d) is the harder polymer.

SYNTHESIS EXAMPLE 1

Fine Particle Dispersion of Polymer Containing Hydroxyl Groups

A 1 litre three-necked flask was equipped with a stirrer and nitrogen inlet tube, and then 50 g of styrene, 20 g of glycidyl methacrylate, 30 g of 2-hydroxyethyl methacrylate, 300 g of a 10% aqueous solution of polyvinyl alcohol (degree of polymerization 500), 200 g of water and 0.5 g of potassium persulphate introduced therein. After passing-in nitrogen gas for about 2 minutes and replacing the atmosphere inside the flask with nitrogen, the introduction of the nitrogen was halted and the flask placed in a water bath at 80° C. While vigorously stirring, the polymerization reaction was carried out for 3 hours. A milky-white polymer dispersion was obtained.

SYNTHESIS EXAMPLE 2

Water-Soluble Polymer 1

To 60 g of vinyl acetate and 40 g of methyl acrylate, there was added 0.5 g of benzoyl peroxide as a polymerization initiator, and then these were dispersed in 300 ml of water containing 3 g of partially saponified polyvinyl alcohol as a dispersion stabilizer plus 10 g of NaCl. The dispersion was stirred for 6 hours at 65° C. and suspension polymerization carried out. The methyl acrylate component content of the copolymer obtained was determined from the NMR spectrum and was 48 mol %. Furthermore, the intrinsic viscosity in benzene solution at 30° C. was 2.10.

Next, 8.6 g of this copolymer was added to a saponification reaction liquid comprising 200 g of methanol, 10 g of water and 40 ml of 5N NaOH, and suspended by stirring. After carrying out saponification for 1 hour at 25° C. the temperature was raised to 65° C. and saponification carried out for a further 5 hours.

The saponification reaction product obtained was thoroughly washed with water and freeze-dried. The degree of saponification was 98.3 mol % and, from the results of infrared spectrum measurement, a broad absorption due to the hydroxyl groups was identified in the region of 3400 $cm^{-1}$ and a strong absorption due to the —$COO^-$ groups was identified at 1570 $cm^{-1}$.

EXAMPLE 1

A 4 g/$m^2$ heat insulating layer was applied by application of a primer liquid comprising the following composition onto a 0.15 mm thick degreased aluminium sheet using a bar coater, and drying for 2 minutes at 200° C.

| <Heat insulating layer composition (solids component concentration 10 wt %)> | |
|---|---|
| (1) "Sanprene" LQ-T1331 (polyurethane resin, produced by Sanyo Chemical Industries Ltd.) | 90 parts by weight |
| (2) "Takenate" B830 (blocked isocyanate, produced by Takeda Chemical Industries Ltd.) | 35 parts by weight |
| (3) SJ9372 (epoxy·phenol·urea resin, produced by the Kansai Paint Co.) | 8 parts by weight |

[Solvent Component]

(4) dimethylformamide

Next, on this there was provided a heat sensitive layer of film thickness 1.5 g/$m^2$ by application of the following heat sensitive layer composition using a bar coater, and drying for 1 minute at 150° C.

| <Heat sensitive layer composition (10 wt % solids component concentration)> | |
|---|---|
| (a) carbon black dispersed rosin-modified maleic acid resin | 25 parts by weight (of which carbon black = 10 parts by weight) |
| (b) iron (III) acetylacetonate (produced by Nakarai Chemical Co. Ltd.) | 20 parts by weight |
| (c) DM622 (epoxy methacrylate containing hydroxyl groups, produced by Nagase Kasei Kogyo K.K.) | 30 parts by weight |
| (d) "Sanprene" LQ-T1331 (polyurethane resin, produced by Sanyo Chemical Industries Ltd.) | 25 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

Next, on this there was provide a silicone rubber layer of film thickness 2 g/$m^2$ by application of the following silicone rubber layer composition using a bar coater, and drying for 1 minute at 125° C.

| <Silicone rubber layer composition (solids component concentration 7 wt %)> | |
|---|---|
| (1) polysiloxane containing vinyl groups | 100 parts by weight |
| (2) hydrogen polysiloxane | 5 parts by weight |
| (3) polymerization inhibitor | 1 part by weight |
| (4) catalyst | 2 parts by weight |

[Solvent Component]

(1) "Isopar" E (produced by Exxon Chemical Japan)

On the laminate obtained as described above, there was laminated 8 μm thick "Lumirror" polyester film (produced by Toray Industries, Inc.) using a calender roller, and there was obtained a directly imageable waterless planographic printing plate precursor.

Subsequently, the "Lumirror" on this printing plate precursor was peeled off, then the precursor fitted to a FX400-AP (plate processing machine, produced by the Toray Engineering Co.), and pulse exposure carried out at a 10 μs exposure time while varying the irradiation energy, using a semiconductor laser(wavelength 830 nm, beam diameter 20 μm).

Next, the aforesaid irradiated plate was developed using an automatic development device TWL-1160 produced by Toray Industries, Inc. At this time, as a pre-treatment liquid, there was employed "PP-1" produced by Toray Industries Inc., water was-used as the developer and as a post-treatment liquid there was used "PA-F" produced by Toray Industries Inc.

When the plate was observed following development, it was found that where the irradiation energy was 300 mJ/s (600 mW) or less, only the silicone layer was eliminated but, at energy levels above this, heat sensitive layer was eliminated along with the silicone rubber layer.

Next, with a hand roller, waterless planographic ink (Waterless S, produced by The Inctech Inc., red) was spread over the entire developed plate face, and a check made to determine at what laser irradiation energy level there was image reproduction. As a result, it was found that in the region above 175 mJ/s (350 mW) the silicone rubber layer in the laser irradiated region was eliminated and the image reproduced.

EXAMPLE 2

A printing plate precursor was prepared in exactly the same way as in Example 1 except that the composition of the heat sensitive layer coating liquid was altered to that give below.

When evaluation was carried out in the same way as in Example 1, it was found that between 225 mJ/s (450 mW) and 450 mJ/ss (900 mW) only the silicone above this heat sensitive layer was eliminated along with the silicone rubber layer.

| <Heat sensitive layer composition (solids component concentration 10 wt %)> | |
|---|---|
| (a) Spirit Nigrosine SJ (Dye Specialities Inc.) | 15 parts by weight |
| (b) iron (III) acetylacetonate (produced by Nakarai Chemical Co. Ltd.) | 20 parts by weight |
| (c) DM622 (epoxy methacrylate containing hydroxyl groups, produced by Nagase Kasei Kogyo K.K.) | 30 parts by weight |
| (d) "Sanprene" LQ-T1331 (polyurethane resin, produced by Sanyo Chemical Industries Ltd.) | 35 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

COMPARATIVE EXAMPLE 1

A printing plate procursor was prepared in exactly the same way as in Example 1 except that the composition of the heat sensitive layer coating liquid was carried to that given below, and when evaluation was carried out in the same way, it was fond that the laser-irradiated silicone rubber layer did not separated and was in a state impossible to develop, so image reproduction was not possible.

| <Heat sensitive layer composition (solids component concentration 10 wt %)> | |
|---|---|
| (b) iron (III) acetylacetonate (produced by Nakarai Chemical Co. Ltd.) | 20 parts by weight |
| (c) DM622 (epoxy methacrylate containing hydroxyl groups, produced by Nagase Kasei Kogyo K.K.) | 30 parts by weight |
| (d) "Sanprene" LQ-T1331 (polyurethane resin, produced by Sanyo Chemical Industries Ltd.) | 50 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

COMPARATIVE EXAMPLE 2

A printing plate precursor was prepared in exactly the same way as in Example 1 except that the composition of the heat sensitive layer coating liquid was altered to that given below, and when evaluation was carried out in the same way it was found that a plate of low sensitivity had been obtained in that the silicone rubber layer was eliminated only at or above 500 mJ/s (1000 mW).

| <Heat sensitive layer composition (solids component concentration 10 wt %)> | |
|---|---|
| (a) Spirit Nigrosine SJ (Dye Specialities Inc.) | 15 parts by weight |
| (c) DM622 (epoxy methacrylate containing hydroxyl groups, produced by Nagase Kasei Kogyo K.K.) | 30 parts by weight |
| (d) "Sanprene" LQ-T1331 (polyurethane resin, produced by Sanyo Chemical Industries Ltd.) | 55 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

EXAMPLE 3

A printing plate precursor was prepared in exactly the same way as in Example 1 except that the composition of the heat sensitive layer coating liquid was altered to that given below, and when evaluation was carried out in the same way, it was found that between 225 mJ/s (450 mW) and 450 mJ/s (900 mW) only the silicone rubber layer was eliminated but in the energy region above this heat sensitive layer was eliminated along with the silicone rubber layer.

| <Heat sensitive layer composition (solids component concentration 10 wt %)> | |
|---|---|
| (a) Spirit Nigrosine SJ (Dye Specialities Inc.) | 15 parts by weight |
| (b) "Nâcem" Ti (produced by the Nippon Kagaku Sangyo Co.) | 20 parts by weight |
| (c) DM622 (epoxy methacrylate containing hydroxyl groups, produced by Nagase Kasei Kogyo K.K.) | 30 parts by weight |
| (d) "Sanprene" LQ-T1331 (polyurethane resin, produced by Sanyo Chemical Industries Ltd.) | 35 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

EXAMPLE 4

A printing plate precursor was prepared in exactly the same way as in Example 1 except that the composition of the heat sensitive layer coating liquid was altered to that given below, and when evaluation was carried out in the same way, it was found that between 175 mJ/s (350 mW) and 425 mJ/s (850 mW) only the silicone rubber layer was eliminated but in the energy region above this heat sensitive layer was eliminated along with the silicone rubber layer.

| <Heat sensitive layer composition (solids component concentration 10 wt %)> | |
|---|---|
| (a) "Kayasorb" IR-820B (infrared light absorbing dye, produced by the Nippon Kayaku Co.) | 10 parts by weight |
| (b) iron (III) acetylacetonate (produced by Nakarai Chemical Co. Ltd.) | 20 parts by weight |
| (c) DM622 (epoxy methacrylate containing hydroxyl groups, produced by Nagase Kasei Kogyo K.K.) | 30 parts by weight |
| (d) "Sanprene" LQ-T1331 (polyurethane resin, produced by Sanyo Chemical Industries Ltd.) | 40 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

EXAMPLE 5

A printing plate precursor was prepared in exactly the same way as in Example 1 except that the compositions of the heat sensative layer coating liquid and the composition of the silicone rubber layer coating liquid were altered to those give below, and when evaluation was carried out in the same way, it was found that between 175 mJ/s (350 mW) and 500 mJ/s (1000 mW) only the silicone rubber layer was eliminated but in the energy region above this heat sensitive layer was eliminated along with the silicone rubber layer.

| <Heat sensitive layer composition (solids component concentration 10 wt %)> | |
|---|---|
| (a) Spirit Nigrosine SJ (Dye Specialities Inc.) | 15 parts by weight |
| (b) "Alumichelate" D (aluminium (III) monoacetylacetonate bisethylacetoacetate, produced by the Kawaken Fine Chemicals Co.) | 20 parts by weight |
| (c) "Sumilite Resin" PR-50731 (novolak resin, produced by the Sumitomo Durez Co.) | 30 parts by weight |
| (d) "Sanprene" LQ-T1331 (polyurethane resin, produced by Sanyo Chemical Industries Ltd.) | 35 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

| <Silicone rubber layer composition (solids component concentration 7 wt %)> | |
|---|---|
| (1) polydimethylsiloxane (molecular weight around 25,000, terminal hydroxyl groups) | 100 parts by weight |
| (2) vinyltri(methylethylketoxime)silane | 10 parts by weight |

[Solvent Component]

(1) "Isopar" E (produced by Exxon Chemical Japan Ltd.)

EXAMPLE 6

A printing plate precursor was prepared in exactly the same way as in Example 5 except that the composition of the heat sensitive layer coating liquid was altered to that given below, and when evaluation was carried out in the same way it was found that between 125 mJ/s (250 mW) and 400 mJ/s (800 mW) only the silicone rubber layer was eliminated but in the energy region above this heat sensitive layer was eliminated along with the silicone rubber layer.

| <Heat sensitive layer composition (solids component concentration 10 wt %)> | |
|---|---|
| (a) "Kayasorb" IR-820B (infrared light absorbing dye, produced by the Nippon Kayaku Co.) | 10 parts by weight |
| (b) iron (III) acetylacetonate (produced by Nakarai Chemical Co. Ltd.) | 20 parts by weight |
| (c) "Sumilite Resin" PR-50731 (novolak resin, produced by the Sumitomo Durez Co.) | 30 parts by weight |
| (d) "Sanprene" LQ-T1331 (polyurethane resin, produced by Sanyo Chemical Industries Ltd.) | 40 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

EXAMPLE 7

A printing plate precursor was prepared in exactly the same way as in Example 5 except that the composition of the heat sensitive layer coating liquid was altered to that given below, and when evaluation was carried out in the same way it was found that between 225 mJ/s (450 mW) and 500 mJ/s (1000 mW) only the silicone rubber layer was eliminated but in the energy region above this heat sensitive layer was eliminated along with the silicone rubber layer.

| <Heat sensitive layer composition (solids component concentration 10 wt %)> | |
|---|---|
| (a) Spirit Nigrosine SJ (Dye Specialities Inc.) | 15 parts by weight |
| (b) "Alumichelate" D (aluminium (III) monoacetylacetonate bisethylacetoacetate, produced by the Kawaken Fine Chemicals Co.) | 10 parts by weight |
| (c) "Sumilac" PC-1 (resol resin, produced by the Sumitomo Durez Co.) | 30 parts by weight |
| (d) "Sanprene" LQ-T1331 (polyurethane resin, produced by Sanyo Chemical Industries Ltd.) | 45 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

EXAMPLE 8

A printing plate precursor was prepared in exactly the same way as in Example 5 except that the composition of the heat sensitive layer coating liquid was altered to that given below, and when evaluation was carried out in the same way it was found that between 175 mJ/s (350 mW) and 425 mJ/s (850 mW) only the silicone rubber layer was eliminated but in the energy region above this heat sensitive layer was eliminated along with the silicone rubber layer.

| <Heat sensitive layer composition (solids component concentration 10 wt %)> | |
|---|---|
| (a) Spirit Nigrosine SJ (Dye Specialities Inc.) | 15 parts by weight |
| (b) "Alumichelate" D (aluminium (III) monoacetylacetonate bisethylacetoacetate, produced by the Kawaken Fine Chemicals Co.) | 20 parts by weight |
| (c) "Sumilac" PC-1 (resol resin, produced by the Sumitomo Durez Co.) | 30 parts by weight |
| (d) "Sanprene" LQ-T1331 (polyurethane resin, produced by Sanyo Chemical Industries Ltd.) | 35 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

COMPARATIVE EXAMPLE 3

A printing plate precursor was prepared in exactly the same way as in Example 5 except that the composition of the heat sensitive layer coating liquid was altered to that given below, and when evaluation was carried out in the same way it was found that a plate of low sensitivity had merely been obtained in that the silicone rubber layer was eliminated only at or above 475 mJ/s (950 mW).

| <Heat sensitive layer composition (solids component concentration 10 wt %)> | |
|---|---|
| (a) Spirit Nigrosine SJ (Dye Specialities Inc.) | 15 parts by weight |
| (c) "Sumilac" PC-1 (resol resin, produced by the Sumitomo Durez Co.) | 30 parts by weight |
| (d) "Sanprene" LQ-T1331 (polyurethane resin, produced by Sanyo Chemical Industries Ltd.) | 55 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

EXAMPLE 9

A printing plate precursor was prepared in exactly the same way as in Example 5 except that the composition of the heat sensitive layer coating liquid was altered to that given below, and when evaluation was carried out in the same way it was found that between 175 mJ/s (350 mW) and 425 mJ/s (850 mW) only the silicone rubber layer was eliminated but in the energy region above this heat sensitive layer was eliminated along with the silicone rubber layer.

| <Heat sensitive layer composition (solids component concentration 10 wt %)> | |
|---|---|
| (a) Spirit Nigrosine SJ (Dye Specialities Inc.) | 15 parts by weight |
| (b) "Nâcem" Ti (produced by the Nippon Kagaku Sangyo Co.) | 20 parts by weight |
| (c) "Ripoxy" VR-90 (epoxy acrylate containing hydroxyl groups, produced by the Showa Highpolymer Co.) | 30 parts by weight |
| (d) "Sanprene" LQ-T1331 (polyurethane resin, produced by Sanyo Chemical Industries Ltd.) | 35 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

EXAMPLE 10

A printing plate precursor was prepared in exactly the same way as in Example 5 excepted that the compositions of the heat sensitive layer coating liquid and of the silicone layer coating liquid were altered to those given below, and when evaluation was carried out in the same way it was found that a plate had been obtained where the silicone rubber layer was eliminated at or above 175 mJ/s.

| <Heat sensitive layer composition (solids component concentration 10 wt %)> | |
|---|---|
| (a) "Kayasorb" IR-820B (infrared absorbing dyestuff, produced by the Nippon Kayaku Co. Ltd.) | 10 parts by weight |
| (b) "Nâcem" Ti (produced by the Nippon Kagaku Sangyo Co.) | 10 parts by weight |
| (c) "Sumilite Resin" PR-50731 (novolak resin, produced by the Sumitomo Durez Co.) | 50 parts by weight |
| (d) "Sanprene" LQ-T1331 (polyurethane resin, produced by Sanyo Chemical Industries Ltd.) | 30 parts by weight |

| [Solvent component] | |
|---|---|
| (1) dimethylformamide | 10 parts by weight |
| (2) tetrahydrofuran | 90 parts by weight |

| <Silicone rubber layer composition (solids component concentration 7 wt %)> | |
|---|---|
| (1) polysiloxane containing vinyl groups | 100 parts by weight |
| (2) hydrogenpolysiloxane | 5 parts by weight |
| (3) polymerization inhibitor | 1 part by weight |
| (4) catalyst | 2 parts by weight |

[Solvent Component]

(1) "Isopar" E (produced by Exxon Chemical Japan Ltd.)

EXAMPLE 11

A printing plate precursor was prepared in exactly the same way as in Example 10 except that, after applying the heat sensitive layer composition with a bar coater, the drying was carried out for 1 minute at 130° C., and when evaluation was carried out in the same way it was found that a plate had been obtained from which the silicone rubber layer was eliminated at or above 150 mJ/s.

EXAMPLE 12

3 g/$m^2$ heat insulating layer was provided by application of a solution comprising the following composition onto a 0.24 mm thickness degreased aluminium sheet and drying for 2 minutes at 200° C.

| <Heat insulating layer composition (solids component concentration 16.7 wt %)> | |
|---|---|
| (1) epoxy·phenol resin "Kan-coat" 90T-25-3094 (produced by the Kansai Paint Co.) | 15 parts by weight |
| (2) "White" UL7E265 (titanium oxide, produced by the Sumika Color Co.) | 2 parts by weight |

| [Solvent component] | |
|---|---|
| (1) dimethylformamide | 85 parts by weight |

Next, on this heat insulating layer there was provided a heat sensitive layer of film thickness 2 g/$m^2$ by applying the following heat sensitive layer composition and drying for 1 minute at 80° C.

| <Heat sensitive layer composition (solids component concentration 12.5 wt %)> | |
|---|---|
| (a) Spirit Nigrosine SJ (Dye Specialities Inc.) | 5 parts by weight |
| (b) "Alumichelate" D (aluminium monoacetylacetonate bisethylacetoacetate, produced by the Kawaken Fine Chemicals Co.) | 30 parts by weight |
| (c) "Sumilac" PC-1 (resol resin, produced by the Sumitomo Durez Co.) | 70 parts by weight |
| (d) "Sanprene" LQ-909L (polyurethane resin, produced by Sanyo Chemical Industries Ltd.) | 20 parts by weight |

| [Solvent component] | |
|---|---|
| (1) tetrahydrofuran | 875 parts by weight |

Furthermore, on this heat sensitive layer there was provided a 2.0 $\mu$m silicone rubber layer by applying the following silicone rubber composition with a bar coater and then carrying out moist heat curing for 1 minute at 100° C.

| <Silicone rubber layer composition (solids component concentration 8.4 wt %)> | |
|---|---|
| (1) polydimethylsiloxane (molecular weight about 35,000, terminal hydroxyl groups) | 100 parts by weight |
| (2) vinyltris(methyl ethyl ketoxime)silane | 9 parts by weight |
| (3) dibutyltin diacetate | 0.5 part by weight |

| [Solvent component] | |
|---|---|
| (1) "Isopar E" (produced by Exxon Chemical Japan) | 1200 parts by weight |

On the laminate obtained as described above, there was laminated 8 $\mu$m thickness "Torayfan" polypropylene film (produced by Toray Industries, Inc.) using a calender roller, and there was obtained a directly imageable waterless planographic printing plate precursor.

Subsequently, laser irradiation was carried out in the same way as in Example 1 and then development carried out in the same way. As the pre-treatment liquid at this time, there was used "PP-F" produced by Toray Industries Inc., water was used as the development liquid, and as the post-treatment liquid there was used "PA-F" produced by Toray Industries Inc.

As a result, a positive type waterless planographic printing plate was obtained where, in a certain energy range, the silicone rubber layer remained only in the areas subjected to laser light irradiation while in the other areas it had separated away.

Furthermore, the printing plate thus obtained was fitted to a Hamada RS46L printing machine (produced by the Hamada Printing Press Co.) and printing carried out on fine quality paper using waterless planographic ink (Dryocolour NSI, cyan, produced by Dainippon Ink & Chemicals Inc.). The minimum value of laser output (mJ/sec) which permitted an image to be reproduced on the printed material was determined and found to be 250 mJ/sec.

COMPARATIVE EXAMPLE 4

When a printing plate precursor was prepared in exactly the same way as in Example 12 except that the (a) Spirit Nigrosine, which is the light-to-heat conversion material in the heat sensitive layer, was removed, and then evaluation carried out in the same way, a plate was merely obtained from which the silicone rubber layer separated over the entire plate face.

COMPARATIVE EXAMPLE 5

When a printing plate precursor was prepared in exactly the same way as in Example 12 except that the (b) "Alumichelate" D, which is the metal chelate compound in the heat sensitive layer, was removed, and then evaluation carried out in the same way, a plate was merely obtained from which the silicone rubber layer separated over the entire plate face.

EXAMPLE 13

A 3 g/m$^2$ heat insulating layer was provided by application of a solution comprising the following composition onto a 0.24 mm thickness degreased aluminium sheet and then drying for 2 minutes at 200° C.

| <Heat insulating layer composition (solids component concentration 17.1 wt %)> | |
|---|---|
| (1) polyurethane resin "Miractran" P22S (produced by the Nippon Miractran Co.) | 100 parts by weight |
| (2) blocked isocyanate "Takenate B830" (produced by Takeda Chemical Industries Ltd.) | 20 parts by weight |
| (3) epoxy·phenol·urea resin "SJ9372" (produced by the Kansai Paint Co.) | 8 parts by weight |
| (4) dibutyltin diacetate | 0.5 part by weight |
| (5) "Finex" 25 (white pigment, produced by the Sakai Chemical Industry Co.) | 10 parts by weight |
| (6) "Ket-Yellow" 402 (yellow pigment, produced by Dainippon Ink & Chemicals Inc.) | 10 parts by weight |

| [Solvent component] | |
|---|---|
| (1) dimethylformamide | 720 parts by weight |

Next, on this heat insulating layer there was provided a heat sensitive layer of film thickness 3 g/m$^2$ by applying the following heat sensitive layer composition and drying for 1 minute at 80° C.

| <Heat sensitive layer composition (solids component concentration 10 wt %)> | |
|---|---|
| (a) carbon black dispersed rosin-modified maleic acid resin | 15 parts by weight (of which carbon black = 10 parts by weight) |
| (b) iron (III) acetylacetonate (produced by Nakarai Chemical Co. Ltd.) | 10 parts by weight |
| (c) "Sumilite Resin" PR-50731 (novolak resin, produced by the Sumitomo Durez Co.) | 20 parts by weight |
| (d) "Epoxyester" 3000M (hydroxyl group-containing acrylate, produced by the Kyoeisha Chemical Co.) | 20 parts by weight |

-continued

| <Heat sensitive layer composition (solids component concentration 10 wt %)> | |
|---|---|
| (e) "Sanprene" LQ-T1331 (polyurethane resin, produced by Sanyo Chemical Industries Ltd.) | 40 parts by weight |
| (f) "TSL" 8370 (silyl group-containing acrylate, produced by the Toshiba Silicone Co.) | 5 parts by weight |

| [Solvent component] | |
|---|---|
| (1) N,N-dimethylformamide | 220 parts by weight |
| (2) tetrahydrofuran | 770 parts by weight |

Furthermore, on this heat sensitive layer, there was applied the following silicone rubber layer composition using a bar coater to provide a dry film thickness of 2.0 μm using drying conditions of 120° C.×1 minute. Otherwise, a printing plate precursor was prepared in exactly the same way as in Example 12, and when evaluation was performed a positive type waterless planographic printing plate was obtained at a laser output of 280 mJ/sec or above.

| <Silicone rubber layer composition (solids component concentration 9.4 wt %)> | |
|---|---|
| (1) α,ω-divinylpolydimethylsiloxane (degree of polymerization 770) | 100 parts by weight |
| (2) HMS-501 (produced by the Chisso Corp., (methyl-hydrogensiloxane) (dimethylsiloxane) copolymer with methyls at both terminals; number of SiH groups/molecular weight = 0.69 mol/g) | 4 parts by weight |
| (3) olefin coordinated platinum | 0.02 part by weight |
| (4) "BY24-808" (reaction inhibitor, produced by the Dow Corning Silicone Co.) | 0.3 part by weight |

| [Solvent component] | |
|---|---|
| (1) "Isopar E" (produced by Esso Chemical) | 1000 parts by weight |

EXAMPLE 14

A printing plate precursor was prepared in exactly the same way as in Example 13 except that the heat sensitive layer was changed to that described below, the dry film thickness was 2.5 $g/m^2$ and the drying conditions were. 150° C.×2 minutes. When evaluation was conducted in the same way, there was obtained a negative type waterless planographic printing plate where just the silicone rubber layer in the laser irradiated regions was removed at a leaser output of 130 mJ/sec or above.

Furthermore, using the processed plate, when the thickness of the heat sensitive layer in the solid image region at a laser output of 200 mJ/sec was measured, it was 2.3 $g/m^2$, so it was that the percentage remaining was 92%.

| <Heat sensitive layer composition (solids component concentration 28 wt %)> | |
|---|---|
| (a) "Kayasorb" IR-820B (infrared absorbing dyestuff, produced by the Nippon Kayaku Co. Ltd.) | 10 parts by weight |
| (b) "Nâcem" Ti (produced by the Nippon Kagaku Sangyo Co.) | 15 parts by weight |
| (c) pentaoxypropylene diamine/glycidyl methacrylate (hydroxyl group containing)/ methyl glycidyl ether = 1/3/1 mol ratio adduct | 15 parts by weight |
| (d) m-xylylene diamine/glycidyl methacrylate (hydroxyl group containing)/methyl glycidyl ether = 1/2/2 mol ratio adduct | 15 parts by weight |
| (e) m-xylylene diamine/glycidyl methacrylate/3-glycidoxypropyl trimethoxysilane = 1/3/1 mol ratio adduct | 3 parts by weight |
| (f) "Denacol" EX-411 (pentaerythritol polyglycidyl ether, produced by Nagase Chemicals Ltd.) | 5 parts by weight |
| (g) "Sanprene" T1331 (polyurethane resin, produced by Sanyo Chemical Industries Ltd., glass transition temperature Tg: −37° C.) | 30 parts by weight |
| (h) maleic acid | 0.5 part by weight |
| (i) "Perhexa" 3M (organic peroxide, produced by Nippon Oil & Eats Co.) | 5 parts by weight |

| [Solvent component] | |
|---|---|
| (1) tetrahydrofuran | 200 parts by weight |
| (2) dimethylformamide | 50 parts by weight |

Furthermore, the initial elastic modulus of the heat sensitive layer was 20 $kgf/mm^2$.

EXAMPLE 15

The heat sensitive layer in Example 14 was changed to that below, and application was carried out to give a dry film thickness of 2.5 $g/m^2$, with the drying being carried out at 80° C.×1 min. Subsequently, using an "Eye Dolphin" 2000 (a metal halide lamp produced by the Iwasaki Electric Co.), the entire face of the heat sensitive layer was irradiated with ultraviolet light for 120 seconds at 11 $mW/cm^2$ in air.

Furthermore, thereafter, a silicone rubber layer was provided in the same way as in Example 14 and a waterless planographic printing plate precursor obtained. When evaluation was carried out in the same way as in Example 14, at a laser output of 130 mJ/sec or above a negative-type waterless planographic printing plate was obtained. Using the processed plate, when the thickness of the heat sensitive layer in the solid image regions at a laser output of 200 mJ/sec was measured, it was 2.25 $g/m^2$, so it was clear that the percentage remaining was 90%.

Furthermore, the initial elastic modulus of the heat sensitive layer was 19 $kgf/mm^2$.

| <Heat sensitive layer composition (solids component concentration 28 wt %)> | |
|---|---|
| (a) "Kayasorb" IR-820B (infrared absorbing dyestuff, produced by the Nippon Kayaku Co. Ltd.) | 10 parts by weight |
| (b) "Nâcem" Ti (produced by the Nippon Kagaku Sangyo Co.) | 15 parts by weight |

-continued

| <Heat sensitive layer composition (solids component concentration 28 wt %)> | |
|---|---|
| (c-1) pentaoxypropylene diamine/glycidyl methacrylate (hydroxyl group containing)/methyl glycidyl ether = 1/3/1 mol ratio adduct | 15 parts by weight |
| (c-2) m-xylylene diamine/glycidyl methacrylate (hydroxyl group containing)/methyl glycidyl ether = 1/2/2 mol ratio adduct | 15 parts by weight |
| (c-3) m-xylylene diamine/glycidyl methacrylate/ 3-glycidoxypropyl trimethoxysilane = 1/3/1 mol ratio adduct | 3 parts by weight |
| (c-4) "Denacol" EX-411 (pentaerythritol polyglycidyl ether, produced by Nagase Chemicals Ltd.) | 5 parts by weight |
| (d) "Sanprene" T-1331 (polyurethane resin, produced by Sanyo Chemical Industries Ltd., glass transition temperature Tg: −37° C.) | 30 parts by weight |
| (e) maleic acid | 0.5 part by weight |
| (f) "Irgacure" 651 (produced by Ciba Geigy, benzyl dimethyl ketal) | 2 parts by weight |
| (g) "Michler's ketone" (4,4'-dimethylaminobenzophenone, produced by the Hodogaya Chemical Co.) | 5 parts by weight |

| [Solvent component] | |
|---|---|
| (1) tetrahydrofuran | 200 parts by weight |
| (2) dimethylformamide | 50 parts by weight |

EXAMPLE 16

A heat sensitive layer and silicone rubber layer identical to those in Example 12 were provided on an 80 μm thickness polyethylene terephthalate film ("Lumirror", produced by Toray Industries Inc.) which had been subjected to an EC treatment. Furthermore, lamination of a cover film was carried out in the same way as in Example 12, and there was obtained a directly imageable waterless planographic printing plate precursor.

The directly imageable printing plate precursor obtained was subjected to laser irradiation in the same way as in Example 12 and, after separating off the cover film, immersion was carried out for 1 minute in a solution mixture of water/diethylene glycol mono-2-ethylhexyl ether: 90/10 (w/w). When the plate face was rubbed using a development pad (produced by the 3M Corp.) which had been soaked in purified water, a positive-type waterless planographic printing plate was obtained with just the silicone rubber layer in the laser irradiated regions of laser output 280 mJ/sec or above selectively remaining and the silicone rubber layer from the other regions being removed.

EXAMPLE 17

Sand-roughened aluminium sheet was subjected to a 2 minute surface treatment in a 5% aqueous solution of zirconium fluoride which had been heated to 80° C., after which it was dried to produce a substrate. On this substrate there was coated the heat sensitive composition from Example 1 to give a dry film thickness of 2.0 g/m$^2$, and by drying for 1 minute at 60° C. there was produced a directly imageable planographic printing plate precursor. Laser irradiation was carried out in the same way as in Example 12, and when development was carried out with a dilute PS plate developer(a negative type developer stock liquid produced by the Fuji Photo Film Co., diluted to 10 times with pure water), there was obtained a negative type conventional pre-sensitized planographic printing plate where only the regions irradiated at a laser output of 100 mJ/sec or above selectively remained.

EXAMPLE 18

A printing plate precursor was prepared in exactly the same way as in Example 12 except that the component (c) "Sumilac" PC-1 (resol resin) was changed to 70 parts by weight of (c) "Maruka Lyncur" PHM-C [poly(p-hydroxystyrene], produced by the Maruzen Petrochemical Co.), and then evaluation carried out in the same way.

As a result, there was obtained a positive type planographic printing plate where just the regions irradiated at a laser output of 280 mJ/sec or above selectively remained.

EXAMPLE 19

A heat sensitive layer of film thickness 2 g/m$^2$ was provided by coating the following heat sensitive layer composition onto the heat insulating layer obtained in Example 1 and drying for 1 minute at 150° C.

| <Heat sensitive layer composition (solids component concentration 11.6 wt %)> | |
|---|---|
| (a) "Sohn Black" (Waterbase) (paste comprising an aqueous dispersion of carbon black, produced by Mitsubishi Kagaku K.K.) | 7 parts by weight |
| (b) iron (III) acetylacetonate (produced by the Nakarai Chemical Co. Ltd.) | 10 parts by weight |
| (c-1) "Gohsenol" KL-05 (polyvinyl alcohol, produced by the Nippon Synthetic Chemical Industry Co.) | 8 parts by weight |
| (c-2) polymer from Synthesis Example 1 | 15 parts by weight |
| (e) "TSL" 8350 (γ-glycidoxypropyl trimethoxysilane, produced by the Toshiba Silicone Co.) | 2 parts by weight |

| [Solvent component] | |
|---|---|
| (1) purified water | 280 parts by weight |
| (2) ethanol | 40 parts by weight |

After applying the following silicone rubber composition onto this heat sensitive layer with a bar coater, moist heat curing was performed for 1 minute at 110° C. to provide a 2.0 μm silicone rubber layer, then lamination of "Torayfan" (12.0 μm polypropylene film produced by Toray Industries Inc.) carried out and a directly imageable waterless planographic printing plate precursor obtained.

| <Silicone rubber layer composition (solids component concentration 8.4 wt %)> | |
|---|---|
| (1) polydimethylsiloxane (molecular weight about 35,000, terminal hydroxyl groups) | 100 parts by weight |
| (2) ethyl triacetoxysilane | 10 parts by weight |
| (3) dibutyltin diacetate | 0.3 part by weight |

| [Solvent component] | |
|---|---|
| (1) "Isopar" G (produced by Exxon Chemical Japan) | 1200 parts by weight |

After peeling away the cover film from the laser-irradiated plate, the plate was immersed for 1 minute in a mixed solution of water/diethylene glycol mono-2-ethylhexyl ether: 95/5 (w/w), and then when the plate face was rubbed using a development pad (produced by the 3M Corp.) soaked with pure water, there was obtained a negative type waterless planographic printing plate from which the silicone rubber layer had been eliminated in the region irradiated by laser of laser output 110 mJ/sec or above.

Furthermore, using the processed plate, when the thickness of the heat sensitive layer in the solid image regions at a laser output of 200 mJ/sec was measured, it was 1.9 $g/m^2$, so the percentage remaining was 95%.

EXAMPLE 20

Continuous line inscribing of the printing plate precursor obtained in Example 19 was carried out using a semiconductor excited YAG laser of wavelength 1064 nm and beam diameter 100 $\mu$m ($1/e^2$). The recording energy was made 0.75 $J/cm^2$.

Subsequently, when the development treatment was carried out in the same way as in Example 19, there was obtained a negative type waterless planographic printing plate from which only the laser-irradiated silicone rubber layer had been removed.

When the thickness of the heat sensitive layer in the image regions was measured, it was 1.75 $g/m^2$, so the percentage remaining was 87.5%.

EXAMPLE 21

Sand-roughened aluminium sheet was subjected to a 2 minute surface treatment in a 5% aqueous solution of zirconium fluoride which had been heated to 80° C., after which it was dried to produce a substrate. On this substrate there was coated the following heat sensitive composition to give a dry film thickness of 5.0 $g/m^2$ and drying was performed for 1 minute at 150° C.

| <Heat sensitive layer composition (solids component concentration 54 wt %)> | |
|---|---|
| (a) "Kayasorb" IR-820B (infrared light absorbing dye, produced by the Nippon Kayaku Co.) | 5 parts by weight |
| (b) "Alumichelate" A (aluminium acetylacetonate, produced by the Kawaken Fine Chemicals Co.) | 20 parts by weight |
| (c-1) "Epoxyester" 80MFA (epoxy acrylate, produced by the Kyoeisha Chemical Co.) | 40 parts by weight |
| (c-2) "Kayamer" PM-21 (phosphorus-containing monomer, produced by the Nippon Kayaku Co.) | 5 parts by weight |
| (d) "Sanprene" LQ-T1331 (polyurethane resin, produced by Sanyo Chemical Industries Ltd.) | 40 parts by weight |
| (e) tolylene diisocyanate | 5 parts by weight |
| (f) acetic acid | 2 parts by weight |

| [Solvent component] | |
|---|---|
| (1) dimethylformamide | 50 parts by weight |
| (2) Ethyl Cellosolve | 25 parts by weight |
| (3) methyl isobutyl ketone | 25 parts by weight |

A silicone rubber layer was provided on this heat sensitive layer in the same way as in Example 19, and a directly imageable waterless planographic printing plate precursor obtained. The precursor obtained was subjected to laser irradiation in the same way as in Example 19 and development performed in the same way. As a result, there was obtained a negative type waterless planographic printing plate at a laser output of 110 mJ/sec or above.

Furthermore, using the processed plate, when the thickness of the heat sensitive layer in the solid image regions at a laser output of 200 mJ/sec was measured, it was 4.9 $g/m^2$, so the percentage remaining was 98%.

EXAMPLE 22

The following heat sensitive layer composition was coated onto the heat insulating layer of Example 12 and then dried for 1 minute at 150° C. to provide a heat sensitive layer of film thickness 2 $g/m^2$.

| <Heat sensitive layer composition (solids component concentration 12.5 wt %)> | |
|---|---|
| (a) "Kayasorb" IR-820B (infrared light absorbing dye, produced by the Nippon Kayaku Co.) | 10 parts by weight |
| (b) "Alumichelate" D (aluminium monoacetylacetonate bisethylacetoacetate, produced by the Kawaken Fine Chemicals Co.) | 30 parts by weight |
| (c) "Sumilac" PC-1 (resol resin, produced by the Sumitomo Durez Co.) | 70 parts by weight |
| (d) "Sanprene" LQ-909L (polyurethane resin, produced by Sanyo Chemical Industries Ltd) | 20 parts by weight |
| (e) γ-aminopropyltriethoxysilane | 3 parts by weight |

| [Solvent component] | |
|---|---|
| (1) tetrahydrofuran | 872 parts by weight |

After applying the following hydrophilic swelling layer composition onto this heat sensitive layer with a bar coater, moist heat curing was performed for 10 minutes at 200° C. to provide a 2.0 $\mu$m hydrophilic swelling layer and a directly imageable planographic printing plate precursor obtained.

| <Hydrophilic swelling layer composition (solids component concentration 10 wt %)> | |
|---|---|
| (1) Hydrophilic Polymer 1 | 75 parts by weight |
| (2) tetraethylene glycol diglycidyl ether | 5 parts by weight |
| (3) Aqueous latex [JSR0548] [carboxy-modified styrene/butadiene copolymer latex; produced by the Japan Synthetic Rubber Co.] | 18 parts by weight |
| (d) 2-aminopropyl trimethoxysilane | 2 parts by weight |

| [Solvent component] | |
|---|---|
| (1) purified water | 900 parts by weight |

After subjecting this printing plate precursor to laser irradiation in the same way as in Example 12, a printing plate was obtained by rubbing with a development pad (made by 3M Corp.) soaked with tap water. Subsequently, the printing plate was fitted to a sheet offset type printing machine [Sprint 25; produced by the Komori Corp.) and, while supplying commercial purified water as dampening water, printing was carried out using fine quality paper(62.5 kg/kiku [636×939 mm]). As a result, negative type printed material was obtained with the image of the laser-irradiated regions reproduced.

The water absorption in the non-image regions was 8.7 $g/m^2$ and the water swelling factor was 290%.

Furthermore, using the processed plate, when the thickness of the heat sensitive layer in the solid image regions at a laser output of 200 mJ/sec was measured, it was 1.6 $g/m^2$, so the percentage remaining was 80%.

EXAMPLE 23

A solution of the following composition was applied onto a degreased aluminium sheet of thickness 0.24 mm, then drying carried out at 200° C. for 2 minutes and a 3 $g/m^2$ heat insulating layer provided.

| <Heat insulating layer composition (solids component concentration 16.7 wt %)> | |
|---|---|
| (1) epoxy·phenol resin "Kan-coat" 90T-25-3094 (produced by the Kansai Paint Co.) | 15 parts by weight |
| (2) "Kayasorb" IR-820B (infrared light absorbing dye, produced by the Nippon Kayaku Co.) | 0.16 part by weight |

| [Solvent Component] | |
|---|---|
| (1) dimethylformamide | 85 parts by weight |

On this heat insulating layer there was provided a heat sensitive layer of film thickness 1 $g/m^2$ by applying the following heat sensitive layer composition and drying for 1 minute at 130° C.

| <<Heat sensitive layer composition (solids component concentration 10 wt %)> | |
|---|---|
| (a) "Kayasorb" IR-820B (infrared light absorbing dye, produced by the Nippon Kayaku Co.) | 10 parts by weight |
| (b) "Nâcem" Ti (produced by the Nippon Kagaku Sangyo Co.) | 10 parts by weight |
| (c) "Sumilite Resin" PR-50731 (novolak resin, produced by the Sumitomo Durez Co.) | 40 parts by weight |
| (d) "Sanprene" LQ-T1331 (polyurethane resin, produced by Sanyo Chemical Industries Ltd) | 30 parts by weight |

-continued

| <<Heat sensitive layer composition (solids component concentration 10 wt %)> | |
|---|---|
| (e) N,N,N'-tri(2-hydroxy-3-methacryloxypropyl)-N'-(2-hydroxy-3-trimethoxysilylpropyloxy-propyl)polyoxypropylene-diamine | 10 parts by weight |

| [Solvent component] | |
|---|---|
| (1) dimethylformamide | 100 parts by weight |
| (2) tetrahydrofuran | 700 parts by weight |
| (3) isopropyl alcohol | 100 parts by weight |

A silicone rubber layer was provided on the heat sensitive layer in the same way as in Example 13, and a directly imageable waterless planographic printing plate precursor obtained. The precursor obtained was subjected to laser irradiation in the same way as in Example 13 and developed in the same way. As a result, a negative type waterless planographic printing plate was obtained at a laser output of 130 mJ/sec or above.

EXAMPLE 24

A printing plate precursor was prepared in exactly the same way as in Example 23 except that, using a bar coater, the following silicone rubber layer composition was coated onto the heat sensitive layer in Example 23, to give a dry film thickness of 2.0 μm and employing drying conditions of 120° C.×1 minute. When evaluation was carried out, a negative type waterless planographic printing plate was obtained at a laser output of 140 mJ/sec and above.

| <Silicone rubber layer composition (solids component concentration 9.4 wt %)> | |
|---|---|
| (1) α,ω-divinylpolydimethylsiloxane (degree of polymerization 770) | 100 parts by weight |
| (2) HMS-501 (produced by the Chisso Corp., (methyl-hydrogensiloxane) (dimethylsiloxane) copolymer with methyls at both terminals; number of SiH groups/molecular weight = 0.69 mol/g) | 4 parts by weight |
| (3) olefin-coordinated platinum | 0.02 part by weight |
| (4) "BY24-808" (reaction inhibitor, produced by the Dow Corning Silicone Co.) | 0.3 part by weight |
| (5) vinyltri(methyl ethyl ketoxime)silane | 4 parts by weight |

| [Solvent component] | |
|---|---|
| (1) "Isopar" E (produced by Esso Chemical) | 1000 parts by weight |

EFFECTS OF THE INVENTION

In accordance with the directly imageable planographic printing plate precursor and the method of producing planographic printing plates of the present invention, by including a light-to-heat conversion material and a metal-containing organic compound, especially a metal chelate compound, in the heat sensitive layer, there is no need for a complex process following laser irradiation, and there are obtained positive and negative type directly imageable planographic printing plate precursor providing printing plates of high sensitivity and high image reproducibility.

The directly imageable planographic printing plate precursor and the method of producing planographic printing plates of the present invention can be suitably used for the directly imageable plate making employed in, for example, short-run printing and general offset printing, and in particular for directly imageable waterless planographic printing plates.

TABLE 1

| | | Example Number | | | | | | | |
|---|---|---|---|---|---|---|---|---|---|
| | | 1 | 2 | 3 | 4 | 5 | 6 | 7 | 8 |
| Substrate | | aluminium sheet | | | | | | | |
| Main components of the heat insulating layer | | polyurethane/blocked isocyanate/epoxy.phenol.urea resin | | | | | | | |
| Heat Sensitive Layer | | | | | | | | | |
| Main Compositional Components | | | | | | | | | |
| light-to-heat conversion material | type | CB | nigrosine | | IR820B | nigrosine | IR820B | nigrosine | |
| | wt % | 10 | 16 | | 10 | 15 | 10 | 15 | |
| metal chelate compound | type | iron acetylacetonate | | Nacem Ti | iron acetylacetonate | Alumichelate D | iron acetylacetonate | Aluminchelate D | |
| | wt % | 20 | | 20 | 20 | 20 | 20 | 10 | 20 |
| compound containing active hydrogen groups | type | epoxy methacrylate | | | | novolak resin | | resol resin | |
| | wt % | 30 | | | | 30 | | 30 | |
| binder | type | polyurethane | | | | | | | |
| | wt % | 25 | 35 | | 40 | 35 | 40 | 45 | 35 |
| drying treatment etc | | 150° C. × 1 minute | | | | | | | |
| type of silicone rubber layer | | addition type | | | | de-oxime type | | | |
| developing treatment | | automactic developer/PP-1 | | | | | | | |
| positive/negative type | | negative type | | | | | | | |
| sensitivity (mJ/s) | | 175 | 225 | | 175 | | 125 | 225 | 175 |
| Note | | | | | | | | | |

TABLE 2

| | | Example Number | | | | | | | | |
|---|---|---|---|---|---|---|---|---|---|---|
| | | 9 | 10 | 11 | 12 | 13 | 14 | 15 | 16 | 17 |
| Substrate | | aluminium sheet | | | | | | | polyester | aluminium sheet |
| Main components of the heat insulating layer | | polyurethane/blocked isocyanate/epoxy.phenol.urea resin | | | epoxy.phenol resin/ titanium oxide | polyurethane/blocked isocyanate/ epoxy.phenol.urea resin/pigment | | | none | none |
| Heat Sensitive Layer | | | | | | | | | | |
| Main Compositional Components | | | | | | | | | | |
| light-to-heat conversion material | type | nigrosine | IR820B | | nigrosine | CB | IR820B | | nigrosine | |
| | wt % | 15 | 10 | | 4 | 9 | 10 | | 4 | |
| metal chelate compound | type | Nacem Ti | | | Alumichelate D | iron acetylacetonate | Nacem Ti | | Alumichelate D | |
| | wt % | 20 | 10 | | 24 | 9 | 15 | | 24 | |
| compound containing active hydrogen groups | type | epoxy methacrylate | novolak resin | | resol resin | novolak/ monomer | monomer/epoxy | | resol resin | |
| | wt % | 30 | 50 | | 56 | 18/18 | 34/5 | | 56 | |
| binder | type | polyurethane | | | polyurethane | polyurethane | polyurethane | | polyurethane | |
| | wt % | 35 | 30 | | 16 | 36 | 30 | | 16 | |
| drying treatment etc | | 150° C. × 1 minute | | 130° C. × 1 min | 80° C. × 1 minute | | 150° C. × 2 min | 80° C. × 1 minute UV irradiation | 80° C. × 1 min | 60° C. × 1 min |
| type of silicone rubber layer | | de-oxime type | addition type | | de-oxime type | addition type | | | de-oxime type | none |
| developing treatment | | automatic developer/PP-1 | | | automatic developer/PP-F | | | | hand develop-ing | alkali developer |
| positive/negative type | | negative type | | | positive type | | negative type | | positive type | negative type PS plate |
| sensitivity (mJ/s) | | 175 | 175 | 150 | 250 | 280 | 130 | 130 | 280 | 100 |
| Note | | | | | | | | | | |

TABLE 3

| | | Example Number | | | | | | |
|---|---|---|---|---|---|---|---|---|
| | | 18 | 19 | 20 | 21 | 22 | 23 | 24 |
| Substrate | | aluminium sheet | | | | | | |
| Main components of the heat insulating layer | | epoxy.phenol resin/titanium oxide | | | none | epoxy.phenol resin/titanium oxide | epoxy.phenol resin/ IR820B | |
| Heat Sensitive Layer | | | | | | | | |
| Main Compositional Components | | | | | | | | |
| light-to-heat conversion material | type | nigrosine | CB | | IR820B | IR820B | IR820B | |
| | wt % | 4 | 17 | | 4 | 7.5 | 10 | |
| metal chelate compound | type | Alumichelate D | iron acetylacetonate | | Alumichelate A | Alumichelate D | Nacem Ti | |
| | wt % | 24 | 24 | | 17 | 22.5 | 10 | |
| compound containing active hydrogen | type | PHM-C | OH group-containing polymer/ polyvinyl alcohol | | epoxy acrylate | resol resin | novolak resin/ monomer | |
| groups | wt % | 56 | 36/19 | | 38 | 53 | 40/10 | |
| binder | type | polyurethane | (polyvinyl alcohol) | | polyurethane | polyurethane | polyurethane | |
| | wt % | 16 | | | 34 | 15 | 30 | |
| drying treatment etc | | 80° C. × 1 min | 150° C. × 1 min | | 150° C. × 1 min | 150° C. × 1 min | 130° C. × 1 min | |
| type of silicone rubber layer | | de-oxime type | deacetoxy type | | | hydophilic layer | addition type | addition type containing silane |
| developing treatment | | automatic developer/ PP-F | hand developing | | | hand developing | automatic developer/ PP-F | |
| positive/negative type | | positive type | negative type | | | negative type conventional plate | negative type | |
| sensitivity (mJ/s) | | 280 | 110 | not measured | 110 | not measured | 130 | 140 |
| Note | | | | YAG laser | | | | |

TABLE 4

| | | Comparative Example Number | | | | |
|---|---|---|---|---|---|---|
| | | 1 | 2 | 3 | 4 | 5 |
| Substrate | | aluminium sheet | | | | |
| Main components of the heat insulating layer | | polyurethane/blocked isocyanate/ epoxy.phenol.urea resin | | | epoxy.phenol resin/ titanium oxide | |
| Heat Sensitive Layer | | | | | | |
| Main Compositional Components | | | | | | |
| light-to-heat conversion material | type | none | nigrosine | | none | nigrosine |
| | wt % | | 15 | | | 5.2 |
| metal chelate compound | type | iron acetylacetonate | none | none | Alumichelate D | none |
| | wt % | 20 | | | 25 | |
| compound containing | type | epoxy methacrylate | | resol resin | resol resin | |
| active hydrogen groups | wt % | 30 | | 30 | 58 | 74 |
| binder | type | polyurethane | | | polyurethane | |
| | wt % | 50 | 55 | 55 | 17 | 21 |
| drying treatment etc | | 150° C. × 1 minute | | | 80° C. × 1 minute | |
| type of silicone rubber layer | | addition type | | de-oxime type | de-oxime type | |
| developing treatment | | automatic developer/PP-1 | | | automatic developer/PP-F | |
| positive/negative type | | (negative type) | | | (positive type) | |
| sensitivity | | impossible to develop | 500 | 475 | silicone separates away | |
| Note | | | | | | |

What is claimed is:

1. A directly imageable planographic printing plate precursor comprising a substrate and, on the substrate, a heat sensitive layer and, on the heat sensitive layer, an ink repellent layer, said heat sensitive layer comprising a light-to-heat conversion material, a binder polymer, an active hydrogen-group containing compound and a metal-containing organic compound, wherein the active hydrogen-group containing compound is selected from a group consisting of a phenol formaldehyde novolak resin, a resol resin, a resorcinol benzaldehyde resin, a pyrogallol acetone resin, a hydroxystyrene polymer or copolymer, a rosin-modified phenolic resin, an epoxy-modified phenolic resin, a lignin-modified phenolic resin, an aniline-modified phenolic resin, and a melamine-modified phenolic resin, further wherein the binder polymer is selected from a group consisting of vinyl polymers, unvulcanized rubber, polyoxides, polyesters, polyurethane and polyamides.

2. A directly imageable planographic printing plate precursor according to claim 1 wherein said ink repellent layer is a silicone rubber layer.

3. A directly imageable planographic printing plate precursor according to claim 2 wherein said silicone-rubber layer is an addition-polymerizing type silicone rubber layer.

4. A directly imageable planographic printing plate precursor according to claim 2 wherein the heat sensitive layer includes a silyl group-containing compound.

5. A directly imageable planographic printing plate precursor plate according to claim 1 wherein the substrate is hydrophilic.

6. A directly imageable planographic printing plate according to claim 1 wherein the metal-containing organic compound is a metal chelate compound.

7. A directly imageable planographic printing plate precursor according to claim 1 wherein the metal-containing organic compound is of at least one type selected from the group consisting of metal diketenates, metal alkoxides, alkyl metals and carboxylic acid metal salts.

8. A directly imageable planographic printing plate precursor according to claim 1 wherein the metal of the metal-containing organic compound is selected from the group consisting of Al, Ti, Mn, Fe, Co, Ni, Cu, Zn, Ge and In.

9. A directly imageable planographic printing plate precursor according to claim 1 wherein the heat sensitive layer has a crosslinked structure.

10. A directly imageable planographic printing plate precursor according to claim 9 wherein the heat sensitive layer has a crosslinked structure based on reaction between the metal-containing organic compound and the compound containing hydroxyl groups.

11. A directly imageable planographic printing plate precursor according to any one of claims 1,2–8 and 9–10 wherein the planographic printing plate is a waterless planographic printing plate.

12. The directly imageable planographic printing plate precursor of claim 1, wherein an amount of the metal-containing organic compound is 5 to 300 parts by weight per 100 parts by weight of the active hydrogen-group containing compound.

13. The directly imageable planographic printing plate precursor of claim 1, wherein said active hydrogen-containing compound and said metal-containing organic compound being crosslinkable by laser irradiation or crosslinked.

14. A method of producing a planographic printing plate in which a directly imageable planographic printing plate precursor is exposed and then developed, said precursor having at least a substrate and, on the substrate, a heat sensitive layer, said heat sensitive layer comprising a light-to-heat conversion material, a binder polymer, an active hydrogen-group containing compound and a metal-containing organic compound, wherein the active hydrogen-group containing compound is selected from a group consisting of a phenol formaldehyde novolak resin, a resol resin, a resorcinol benzaldehyde resin, a pyrogallol acetone resin, a hydroxystyrene polymer or copolymer, a rosin-modified phenolic resin, an epoxy-modified phenolic resin, a lignin-modified phenolic resin, an aniline-modified phenolic resin, and a melamine-modified phenolic resin, further wherein the binder polymer is selected from a group consisting of vinyl polymers, unvulcanized rubber, polyoxides, polyesters, polylurethanes and polyamides.

15. A method according to claim 14 in which, following said development, image regions on the planographic printing plate are dyed using a dye liquid.

16. The method of producing a planographic printing plate of claim 14, wherein said active hydrogen-containing compound and said metal-containing organic compound being crosslinkable by laser irradiation or crosslinked.

17. A directly imageable planographic printing plate precursor comprising a substrate and, on the substrate, a heat sensitive layer and, on the heat sensitive layer, an ink repellent layer, said heat sensitive layer comprising a light-to-heat conversion material, an active hydrogen-group containing compound, a metal-containing organic compound and a binder polymer, wherein the binder polymer is selected from a group consisting of vinyl polymers, unvulcanized rubber, polyoxides, polyesters, polyurethanes and polyamides.

18. A directly imageable planographic printing plate precursor according to claim 1, wherein of the binder polymer is no more than 20° C.

* * * * *

UNITED STATES PATENT AND TRADEMARK OFFICE

CERTIFICATE OF CORRECTION

PATENT NO. : 6,777,156 B1
DATED : August 17, 2004
INVENTOR(S) : Kazuki Goto et al.

It is certified that error appears in the above-identified patent and that said Letters Patent is hereby corrected as shown below:

Column 37, line 61- Column 38, line 67,
Should read as follows -- A directly imageable planographic printing plate precursor comprising a substrate and, on the substrate, a heat sensitive layer and, on the heat sensitive layer, an ink repellant layer, said heat sensitive layer comprising a light-to-heat conversion material, an active hydrogen-group containing compound, a metal-containing organic compound and a binder polymer, wherein the binder polymer is selected from a group consisting of a vinyl polymer, an unvulcanized rubber, a polyoxide, a polyester, a polyurethane and a poly
amide. --

Column 39,
Lines 1-3, should read as follows -- A directly imageable planographic printing plate precursor of Claim 1, wherein the active hydrogen-group containing compound is selected from a group consisting of a phenol formaldehyde novolak resin, a resol resin, a resorcinol benzaldehyde resin, a pyrogallol acetone resin, a hydroxystyrene polymer or copolymer, a rosin-modified phenolic resin, an epoxy-modified phenolic resin, a ligin-modified phenolic resin, an aniline-modified phenolic resin, and a melamine-modified phenolic resin.
Lines 4-6, should read as follows -- A directly imageable planographic printing plate precursor according to Claim 1 wherein said ink repellent layer is a silcone rubber layer. --
Lines 7-9, should read as follows -- A directly imageable planographic printing plate precursor according to Claim 3 wherein said silicone-rubber layer is an addition-polymerizing type silicone rubber layer. --
Lines 10-12, should read as follows -- A directly imageable planographic printing plate precursor according to Claim 1 wherein the heat sensitive layer includes a silyl group-containing compound. --
Lines 13-16, should read as follows -- A directly imageable planographic printing plate precursor according to Claim 1 wherein the substrate is hydrophilic. --
Lines 17-21, should read as follows -- A directly imageable planographic printing plate precursor according to Claim 1 wherein the metal-containing organic compound is a metal chelate compound. --
Lines 22-26, should read as follows -- A directly imageagle planographic printing plate precursor according to Claim 1 wherein the metal-containing organic compound is of at least one type selected from the group consisting of a metal diketenate, a metal alkoxide, an alkyl metal and a carboxylic acid metal salt. --
Lines 27-29, should read as follows -- A directly imageable planographic printing plate precursor according to Claim 1 wherein the metal of the metal-containing organic compound is selected from the group consisting of AI, Ti, Mn, Fe, Co, Ni, Cu, Zn, Ge and In. --

UNITED STATES PATENT AND TRADEMARK OFFICE
CERTIFICATE OF CORRECTION

PATENT NO. : 6,777,156 B1 
DATED : August 17, 2004
INVENTOR(S) : Kazuki Goto et al.

It is certified that error appears in the above-identified patent and that said Letters Patent is hereby corrected as shown below:

Column 39 (cont,d'),
Lines 30-34, should read as follows -- A directly imageable planographic printing plate precusor according to Claim 1 wherein the heat sensitive layer has a crosslinked structure. --
Lines 35-38, should read as follows -- A directly imageable planographic printing plate precursor according to Claim 10 wherein the crosslinked structure is based on a reaction between the metal-containing organic compound and the compound containing hydroxyl group. --
Lines 39-44, should read as follows, A directly imageable planographic printing plate precursor according to any one of Claims 1-11 wherein the planographic printing plate is a waterless planographic printing plate. --

Column 39, line 45- Column 40, line 3,
Should read as follows -- The directly imageable planographic printing plate prescursor of Claim 1, wherein an amount of the metal-containing organic compound is 5 to 300 parts by weight per 100 parts by weight of the active hydrogen-group containing compound. --

Column 40,
Lines 4-21, should read as follows -- The directly imageable planographic printing plate precursor of Claim 1, wherein said active hydrogen-containing compound and said metal-containing organic compound are crosslinkable by lases irradiation or crosslionked. --
Lines 22-24, should read as follows -- A directly imageable planographic printing plate precursor according to Claim 1, wherein the glass transition temperature of the binder polymer is no more than 20°C. --
Lines 25-28, A method of producing a planographic printing plate in which a directly imageable planographic printing plate precursor is exposed and then developed, said precursor having at least a substrate and, on the substrate, a heat sensitive layer, said heat sensitive layer comprising a light-to-heat conversion material, a binder polymer, an active hydrogen-group containing compound is selected from a group consisting of a phenol formaldehyde-group containing compound is selected from a group consisting of a phenol formaldehyde novolak resin, a resol resin, a resoircinol benzaldehyde resin, a pyrogallol acetone resin, a hydroxystyrene polymer or copolymer, a rosin-modified phenolic resin, an epoxy-modified phenolic resin, a lignin-modified phenolic resin, an aniline-modified phenolic resin, and a melamine-modified phenolic resin, further wherein the binder polymer is selected from a group consisting of vinyl polymers, unvulcanized rubber, polyoxides, polyesters, polyurethanes and polyamides. --

UNITED STATES PATENT AND TRADEMARK OFFICE

CERTIFICATE OF CORRECTION

PATENT NO. : 6,777,156 B1 
DATED : August 17, 2004
INVENTOR(S) : Kazuki Goto et al.

It is certified that error appears in the above-identified patent and that said Letters Patent is hereby corrected as shown below:

<u>Column 40, (cont'd,)</u>
Lines 29-38, should read as follows -- A method according to Claim 16 in which, following said development, an image region on the planographic plate is dyed using a dye liquid. --
Lines 39-41, The method of producing a planographic printing plate of Claim 16, wherin said active hydrogen-containg compound and said metal-containing organic compound are crosslinkable by laser irradiation or crosslinked. --
Line 42, add the following claims -- 19 A method of producing a planographi printing plate of Claim 1 in which a directly imageable planographic printing plate precursor is exposed and then developed. --
-- 20 The method of Claim 19, wherein the active hydrogen-group containing compound is selected from a group consisting of a phenol formaldehyde novolak resin, a resol resin, a resorcinol benzaldehyde resin, a pyrogallol acetone resin, a hydroxystrene polymer or copolymer, a rosin-modified phenolic resin, an epoxy-modified phenolic resin, a lignin-modifield phenolic resin, an aniline-modified phenolic resin, and a melamine-modified phenolic resin. --
-- 21 The method according to Claim 19 in which, following said development, an image region on the planographic printing plate is dyed using a dye liquid. --

Signed and Sealed this

Third Day of May, 2005

JON W. DUDAS
*Director of the United States Patent and Trademark Office*

UNITED STATES PATENT AND TRADEMARK OFFICE

CERTIFICATE OF CORRECTION

PATENT NO. : 6,777,156 B1 Page 1 of 1
APPLICATION NO. : 09/188598
DATED : August 17, 2004
INVENTOR(S) : Kazuki Goto et al.

It is certified that error appears in the above-identified patent and that said Letters Patent is hereby corrected as shown below:

In the Claims:

In Column 40, lines 4-21, replace “lases” to --laser--;

replace “crosslionked” to --crosslinked--

In Column 40, line 42, replace “planographi” to --planographic--;

In Column 40, in claim 20, replace “modifield” to --modified--

Signed and Sealed this

Twelfth Day of September, 2006

JON W. DUDAS
*Director of the United States Patent and Trademark Office*